(12) United States Patent
Nakagawa

(10) Patent No.: US 6,500,710 B2
(45) Date of Patent: Dec. 31, 2002

(54) METHOD OF MANUFACTURING A NONVOLATILE SEMICONDUCTOR MEMORY DEVICE

(75) Inventor: Shinichi Nakagawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/885,968

(22) Filed: Jun. 22, 2001

(65) Prior Publication Data

US 2002/0008275 A1 Jan. 24, 2002

Related U.S. Application Data

(62) Division of application No. 09/454,996, filed on Dec. 6, 1999, now Pat. No. 6,274,907.

(30) Foreign Application Priority Data

Jun. 15, 1999 (JP) ............................................. 11-167750

(51) Int. Cl.[7] .................. H01L 21/8239; H01L 21/336; H01L 21/762
(52) U.S. Cl. ....................... 438/257; 438/151; 438/279; 438/412; 438/479
(58) Field of Search ................................ 438/149, 151, 438/157, 161, 163, 164, 257–267, 279, 412, 479, 517, 778, FOR 155; 257/314–326, 347–351

(56) References Cited

U.S. PATENT DOCUMENTS

| 5,180,680 | A | 1/1993 | Yang ............................ 437/38 |
| 5,297,082 | A | 3/1994 | Lee ............................. 365/185 |
| 5,376,560 | A | 12/1994 | Aronowitz et al. ............ 437/24 |
| 5,559,048 | A | 9/1996 | Inoue ........................... 437/43 |
| 5,698,879 | A | 12/1997 | Aritome et al. ............. 257/315 |
| 5,889,303 | A | 3/1999 | Eckert et al. ............... 257/316 |
| 2002/0013028 | A1 * | 1/2002 | Prall et al. .................. 438/257 |

* cited by examiner

Primary Examiner—George C. Eckert, II
Assistant Examiner—Marcos D. Pizarro-Crespo
(74) Attorney, Agent, or Firm—Armstrong, Westerman & Hattori, LLP

(57) ABSTRACT

On a SIMOX substrate having a plurality of STI layers and first conductivity type semiconductor layers disposed in the row direction, a stacked-layer structure SS is formed on a gate dielectric film formed on the first conductivity type semiconductor layer, the structure SS being made of a first polysilicon film, a second gate dielectric film and a second polysilicon film. Second conductivity type source and drain regions are formed in the first conductivity type semiconductor layer on both sides of the structure SS. In a plurality of source regions adjacent in the column direction between the stacked-layer structures SS, a common source line CSL is formed which is made of second conductivity type source region connecting semiconductor regions, source regions and conductive films formed on these semiconductor and source regions.

8 Claims, 24 Drawing Sheets

METHOD OF MANUFACTURING A NONVOLATILE SEMICONDUCTOR MEMORY DEVICE

This application is a division of prior application Ser. No. 09/454,996 filed Dec. 6, 1999, now U.S. Pat. No. 6,274,907.

This application is based on Japanese patent application No. HEI 11-167750, filed on Jun. 15, 1999, all the contents of which are incorporated herein by reference.

BACKGROUND OF THE INVENTION a) Field of the Invention

The present invention relates to a nonvolatile semiconductor memory device capable of reading, writing and erasing data and its manufacture method using SOI (silicon on insulator), SIMOX (separation by implanted oxygen) and the like.

Because of ultra fine patterns and a rapid increase in the memory capacity, nonvolatile semiconductor memories such as flash memories and EEPROMs are expected to be used as alternatives of hard disks widely used as storage devices, and some of then are actually used as such alternatives. If flash memories, EEPROMs or the like can be integrated highly to provide a large memory capacity sufficient for the alternatives of hard disks, many advantages are expected. Namely, products using such memories are resistant to vibrations because mechanical components are not used, and have a low power consumption which is suitable for a battery operation of the products, particularly for various types of portable digital equipments. New techniques allowing a much higher integration and larger capacity have been long desired.

b) Description of the Related Art

A field oxide film as an element separation region of a flash memory, EEPROM or the like is formed on a semiconductor substrate to a thickness of 400 nm to 800 nm by local oxidation of silicon (LOCOS).

On the substrate formed with element separation regions through LOCOS, a first gate dielectric film, a floating gate (polysilicon), a second gate dielectric film, and a control gate (polysilicon) are sequentially laminated to form the memory cell structure of a nonvolatile memory. The control gate extends in a direction (column direction) crossing the element separation region to form a word line of the nonvolatile semiconductor memory.

A common source wiring line running in parallel with the word line is formed by selectively removing the LOCOS oxide film between adjacent two control gates and implanting arsenic or the like into the p-type semiconductor substrate under the conditions of, for example, a dose of $3 \times 10^{15}$ cm$^{-2}$ and an acceleration energy of 60 keV. Source regions (each being generally formed between adjacent two control gates) formed in the semiconductor substrate on one side of the floating gate are electrically connected in the column direction by the impurity doped regions to form the common source region.

The nonvolatile semiconductor memory device described above has, however, an element separation width limit and is not suitable for ultra fine patterning because LOCOS is used for element separations.

This problem also occurs when a hybrid nonvolatile semiconductor memory device is formed having a logic circuit and a nonvolatile semiconductor memory device formed on the same substrate.

It is essential to make fine transistors in order to speed up the operation of a logic circuit. As a transistor is made fine (e.g., a short gate length), it is necessary to shallow the depth of the source/drain regions. In order to retain a certain degree of a current capacity, the doping concentration of the source/drain regions is required to be set high. In this case, parasitic capacitance increases and hinders the high speed operation of a nonvolatile semiconductor memory device.

Instead of forming the common source region by etching the element separation region through self-alignment using the control gates (actually, sidewall spacers formed on the side walls of the control gates) as a mask, a nitride film patterned by using photoresist may be used as an etching mask. In this case, the edge of the resist pattern is rounded and so the edge of the nitride film is rounded. Therefore, there is a variation in the etching amounts of the element separation region so that memory cells of the nonvolatile memory device have a variation in their characteristics.

Further, since adjacent source regions are connected only by regions (doped layers) formed by implanting arsenic or the like into the p-type semiconductor substrate, the sheet resistance of the common source region is high. With a high sheet resistance, a voltage dropped by this resistance becomes high. Therefore, when data stored in the memory device is erased, a variation in the accumulated charge amounts in the floating gates of a plurality of memory cells becomes large.

SUMMARY OF THE INVENTION

It is an object of the present invention to provide a high performance nonvolatile semiconductor memory device capable of a high speed operation and a high integration.

According to one aspect of the present invention, there is provided a nonvolatile semiconductor memory device comprising: a semiconductor substrate; an underlying dielectric layer formed on the semiconductor substrate; a plurality of first conductivity type striped-shape semiconductor layers formed on the underlying dielectric layer and disposed apart from each other in a row direction; a trench formed between each pair of adjacent first conductivity type semiconductor layers and extending in the row direction; a plurality of buried dielectric portions filled with a separation dielectric layer and formed discontinuously in the row direction in each of the trenches and aligned in a column direction; an opening formed in the underlying dielectric layer between the buried dielectric portions adjacent in the column direction; at least a first gate dielectric film formed on each of the first conductivity type semiconductor layers, a plurality of floating gates each formed on each of the first gate dielectric films and all separated in the column direction on the buried dielectric portions, a second gate dielectric film formed on each of the floating gates, and a plurality of control gates formed on the second gate dielectric films and extending in same column directions as the plurality of floating gates; a source region of a second conductivity type formed in the first conductivity type semiconductor layer between the openings adjacent in the column direction on one side of each of the floating gates; a drain region of a second conductivity type formed in the first conductivity type semiconductor layer between the buried dielectric portions adjacent in the column direction on the other side of each of the floating gates; a source region connecting semiconductor layer of the second conductivity type being continuous with the source region and formed at least on the semiconductor substrate in the trench formed in the opening between the source regions in the column direction; and a conductive film formed on the source region connecting semiconductor layers and the source regions and extending in the column direction.

According to another aspect of the present invention, there is provided a method of manufacturing a nonvolatile semiconductor memory device comprising the steps separating a first conductivity type semiconductor layer formed on a semiconductor substrate having a buried dielectric layer on a front surface side of the semiconductor substrate, by forming a plurality of trenches elongated in a row direction; filling a dielectric layer in the trench; forming a first gate dielectric film at least on the first conductivity type semiconductor layer; forming a first conductive polysilicon layer on the substrate formed with the first gate dielectric film; removing the first polysilicon layer to leave islands disposed apart from each other in the row direction; forming a second gate dielectricfilm at least on a surface of the first polysilicon layer; forming a second polysilicon layer on the second gate dielectric film; etching at least the second polysilicon layer, the second gate dielectric layer and the first polysilicon layer in a striped-shape in a column direction to form a stacked-layer structure including the second polysilicon layer, the second gate dielectric layer and the first polysilicon layer; forming source and drain regions in the first conductivity type semiconductor layer on both sides of the stacked-layer structure by alternately introducing impurities of the first conductivity type and impurities of a second conductivity type opposite to the first conductivity type; forming dielectric side spacer films on both side walls of the stacked-layer structure extending in the column direction; removing the dielectric layer filled in the trench between source regions adjacent in the column direction and the buried dielectric layer under the dielectric layer to expose a surface of semiconductor; growing a source region connecting semiconductor layer at least on the semiconductor surface exposed by removing the buried dielectric layer; introducing the second conductivity type impurities at least into the source region connecting semiconductor layer; and forming a conductive film at least on the source regions and the source region connecting semiconductor layers, the conductive film extending in a the column direction same as a direction of the source regions and the source region connecting semiconductor layers.

As above, parasitic resistance of each semiconductor element of the nonvolatile semiconductor memory device reduces and a variation in the characteristics of the semiconductor element reduces. The width of an element separation region can be narrowed.

High speed operation, high uniformity and high integration of the nonvolatile semiconductor device are therefore possible.

BRIEF DESCRIPTION OF THE DRAWINGS

FIG. 3A is the cross sectional view taken along line A–A' shown in FIG. 1 and FIG. 3B is the cross sectional view taken along line D–D' shown in FIG. 1.

FIG. 9A is the plan view, FIG. 9B is the cross sectional view taken along line B–B' shown in FIG. 1 and FIG. 9C is the cross sectional view taken along line D–D' shown in FIG. 1.

FIG. 10A is the cross sectional view corresponding to that taken along line B–B' shown in FIG. 1 and FIG. 10B is the cross-sectional view corresponding to those taken along line C–C' and D–D' shown in FIG. 1.

FIG. 11A is the cross sectional view corresponding to that taken along line B–B' shown in FIG. 1, FIG. 11b is the cross sectional view taken along line C–C' shown in FIG. 1 and FIG. 11C is the cross sectional view taken along line D–D' shown in FIG. 1.

FIG. 12A is the cross sectional view corresponding to that taken along line B–B' shown in FIG. 1, FIG. 12B is the cross sectional view taken along line C–C' shown in FIG. 1 and FIG. 12C is the cross sectional view taken along the D–D' shown in FIG. 1.

FIG. 13A is the cross sectional view taken along line A–A' shown in FIG. 1 and FIG. 13B is the cross sectional view taken along line D–D' shown in FIG. 1.

FIG. 14A is the cross sectional view taken along line A–A' shown in FIG. 1 and FIG. 14B is the cross sectional view taken along line D–D' shown in FIG. 1.

FIG. 15A is the cross sectional view taken along line A–A' shown in FIG. 1 and FIG. 15B is the cross sectional view taken along line B–B' shown in FIG. 1.

FIG. 16A is the cross sectional view taken along line A–A' shown in FIG. 1, FIG. 16B is the cross sectional view taken along line B–B' shown in FIG. 1 and FIG. 16C is the cross sectional view taken along line D–D' shown in FIG. 1.

FIG. 17A is the cross sectional view taken along line A–A' shown in FIG. 1, FIG. 17B is the cross sectional view taken along line B–B' shown in FIG. 1 and FIG. 17C is the cross sectional view taken along line D–D' shown in FIG. 1.

FIG. 18A is the cross sectional view taken along line A–A' shown in FIG. 1, FIG. 18B is the cross sectional view taken along line B–B' shown in FIG. 1 and FIG. 18C is the cross sectional view taken along line D–D' shown in FIG. 1.

FIG. 19A is the cross sectional view taken along line A–A' shown in FIG. 1, FIG. 19D is the cross sectional view taken along line C–C' shown in FIG. 1.

FIG. 20A is the cross sectional view taken along line A–A' shown in FIG. 1, FIG. 20B is the cross sectional view taken along line D–D' shown in FIG. 1, FIG. 20C is the cross sectional view taken along line C–C' shown in FIG. 1 and FIG. 20D is the cross sectional view taken along line B–B' shown in FIG. 1.

FIG. 21A is the cross sectional view taken along line A–A' shown in FIG. 1 and FIG. 21B is the cross sectional view taken along line B–B' shown in FIG. 1.

FIG. 22A is the cross sectional view taken along line C–C' shown in FIG. 1 and FIG. 22B is the cross sectional view taken along line D–D' shown in FIG. 1.

FIG. 24A is the cross sectional view taken along line A–A' shown in FIG. 1, FIG. 24B is the cross sectional view taken along line B–B' shown in FIG. 1, FIG. 24C is the cross sectional view taken along line D–D' shown in FIG. 1 and FIG. 24D is the cross sectional view taken along line C–C' shown in FIG. 1.

DETAILED DESCRIPTION OF THE PREFERRED EMBODIMENTS

An embodiment of the invention will be described with reference to the accompanying drawings.

The structure of a nonvolatile semiconductor memory device and its manufacture method according to a first embodiment of the invention will be described with reference to FIG. 1 to FIG. 22B.

Figure 1:
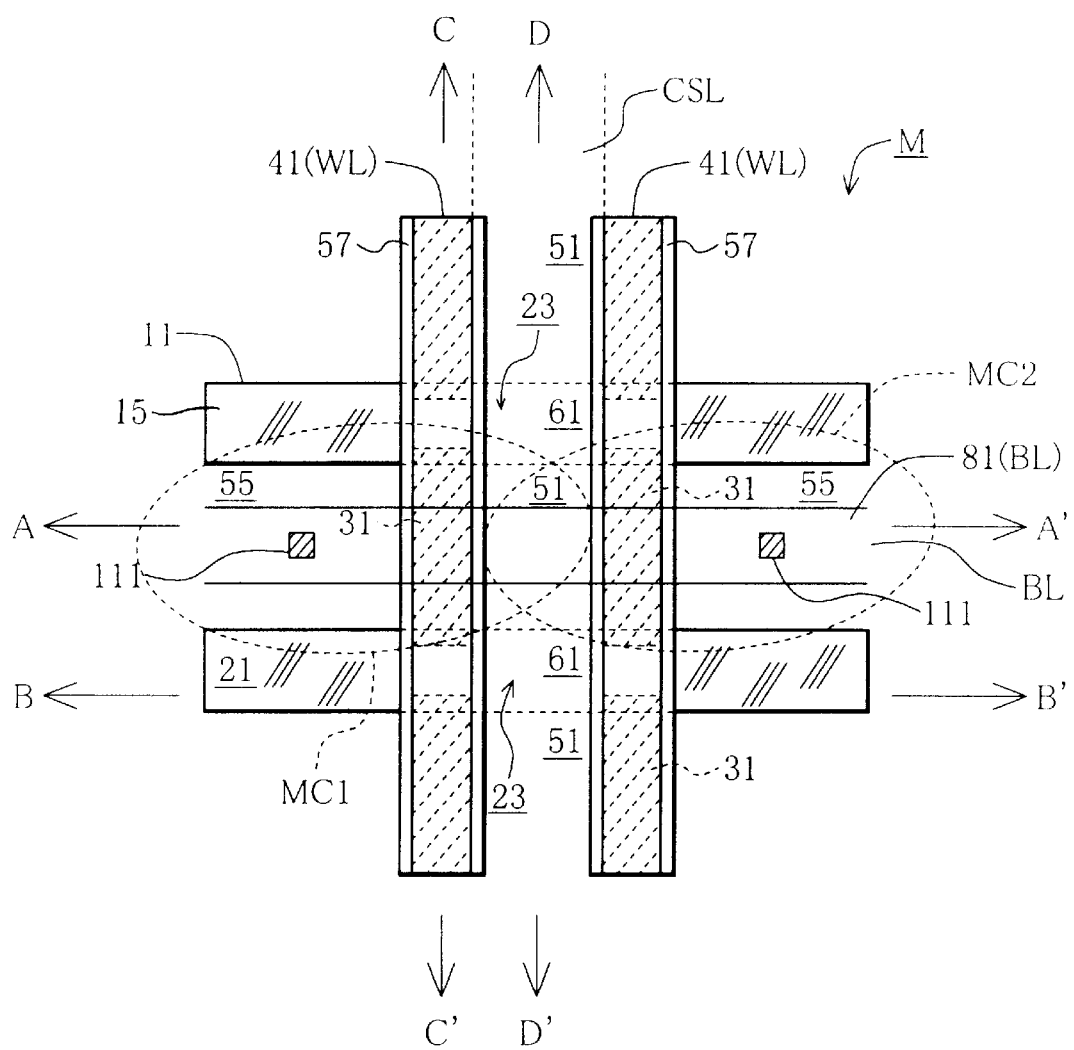
FIG. 1 is a plan view of a nonvolatile semiconductor memory device according to a first embodiment of the invention.

FIG. 1 is a plan view showing the brief layout of a NOR type flash memory as an example of a nonvolatile semiconductor memory device.

A portion of a NOR type flash memory M is shown in FIG. 1. The NOR type flash memory shown in FIG. 1 has memory cells MC1 and MC2. A common source line CSL shared by both the memory cells MC1 and MC2 is disposed therebetween in a column direction. For the memory cells MC1 and MC2, word lines WL are disposed in parallel with the common source lines CSL and a bit line B is disposed in a row direction.

FIG. 2 to FIG. 22B are cross sectional views showing the manufacture processes for the NOR type flash memory shown in FIG. 1.

FIG. 2 to FIG. 22B are the cross sectional views illustrating corresponding manufacture processes and taken along lines A–A', B–B', C–C' and D–D' shown in FIG. 1. In the cross sectional views of FIG. 2 to FIG. 22B illustrating a manufacture method for the NOR type flash memory M, each correspondence with the plan view of FIG. 1 is indicated by affixing A to D at the upper left corners and A' to D' at the upper right corners.

Figure 2:
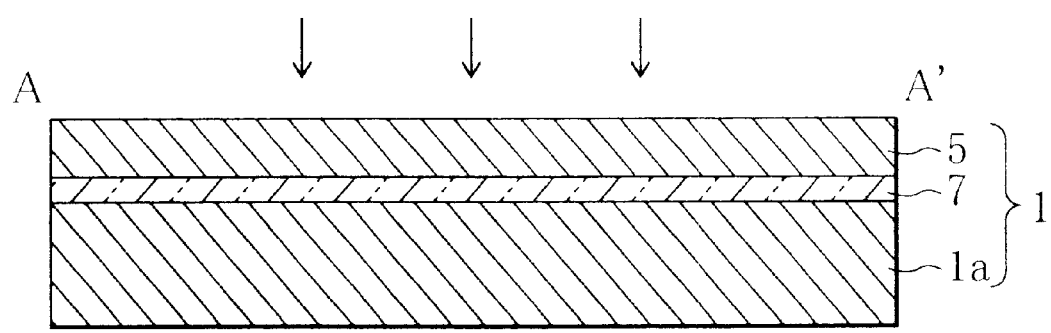
FIG. 2 is a cross sectional view showing the structure of a SIMOX substrate and illustrating the manufacture processes for the nonvolatile semiconductor memory device according to the first embodiment of the invention.

FIG. 2 is a cross sectional view showing the structure of a SIMOX (separation by ion implantation of oxygen) substrate. A buried dielectric layer 7 is formed in a p-type silicon substrate 1 by SIMOX techniques. Ions $^{16}O^+$ are implanted over the whole area of the p-type silicon substrate 1. An ion implantation acceleration energy is 180 keV and a dose is $7\times10^{17}$ cm$^{-2}$. Thereafter, a heat treatment is executed, for example, for 60 minutes to 120 minutes at 1300° C. With this heat treatment, the buried dielectric layer 7 made of $SiO_2$ having a thickness of 100 nm is formed in the p-type silicon substrate 1.

On the surface side of the p-type silicon substrate formed with the buried dielectric layer 7, a p-type silicon layer (first conductivity type semiconductor layer) 5 having a thickness of 300 nm is left, being electrically isolated from a p-type silicon substrate portion 1a on the bottom side. Because of the presence of the dielectric layer 7, a wiring parasitic capacitance of an integrated circuit to be formed in the p-type silicon layer 5 can be reduced.

The thickness of the buried dielectric layer 7 is preferably in a range from 50 nm to 400 nm. The thickness of the p-type silicon layer (first conductivity type semiconductor layer) 5 is preferably in a range from 30 to 300 nm. The thicknesses of these layers can be adjusted by an ion implantation acceleration energy, a dose, annealing conditions after the ion implantation and the like. The SIMOX substrate 1 is hereinafter defined as a substrate constituted of the bottom side p-type silicon layer 1a, buried dielectric layer 7 and surface side p-type silicon layer (first conductivity type semiconductor layer) 5.

With reference to FIG. 3A to FIG. 6, a method of electrically separating active regions in the upper p-type silicon layer 5 of the SIMOX substrate 1 will be described.

Figure 3A:
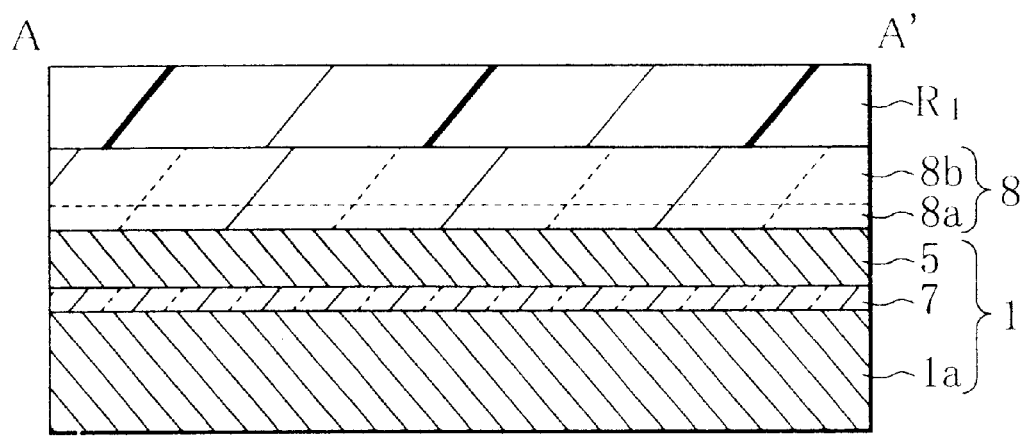
FIGS. 3A and 3B are cross sectional views showing the structure of the SIMOX substrate after an STI pattern is formed and illustrating the manufacture processes for the nonvolatile semiconductor memory device according to the first embodiment of the invention.
Figure 3B:
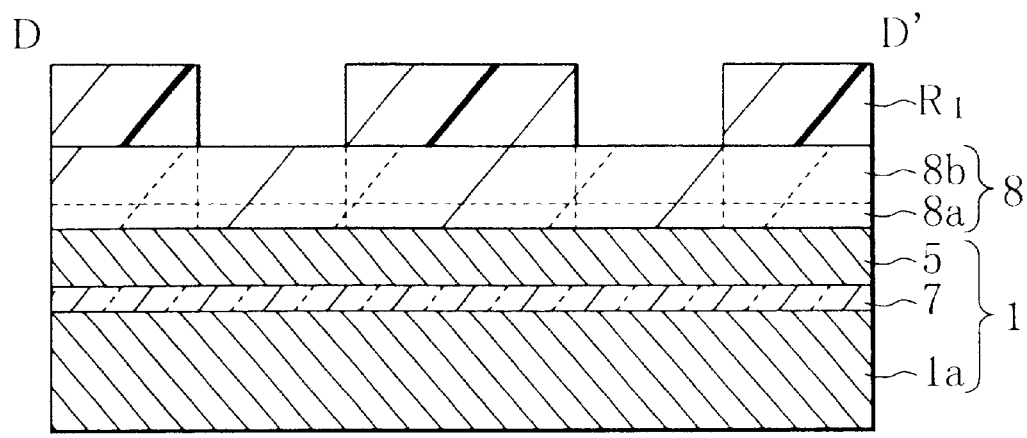

As shown in FIGS. 3A and 3B, a dielectric etching stopper film 8 is formed on the SIMOX substrate 1, the stopper film 8 being made of a thermal oxidation film 8a having a thickness of 12 nm and a nitride film 8b having a thickness of 200 nm.

As shown in FIGS. 3A and 3B, a photoresist pattern $R_1$ for forming electrically separated active regions is formed through known photolithography. As shown in the cross sectional view of FIG. 3A taken along line A–A' of FIG. 1, the photoresist pattern $R_1$ extends in the row direction. As shown in the cross sectional view of FIG. 3B taken along line D–D' of FIG. 1, the photoresist pattern $R_1$ is formed being intermittently disconnected in the column direction.

By using the photoresist pattern $R_1$ as a mask, the dielectric etching stopper film 8 made of the 12 nm thick thermal oxidation film 8a and 200 nm thick nitride film 8b are etched. Thereafter, the photoresist pattern $R_1$ is removed. A pattern of the left dielectric etching stopper film 8 is used as a mask when the p-type semiconductor layer 5 and buried dielectric layer 7 are etched.

Figure 4:
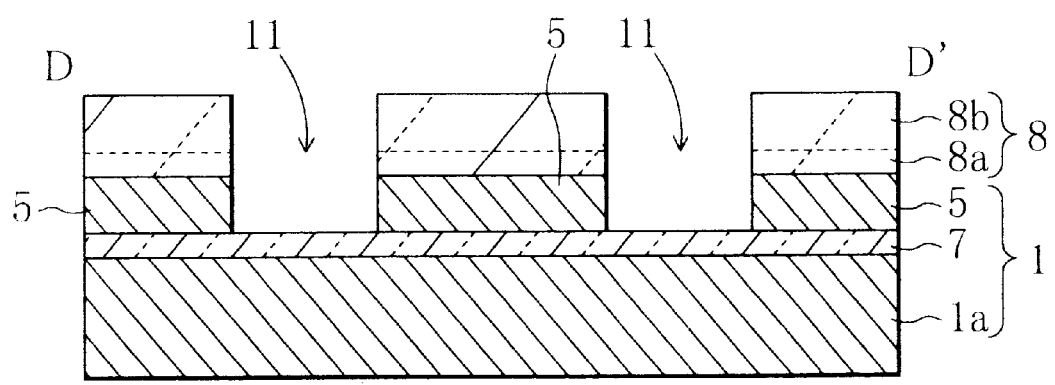
FIG. 4 is a cross sectional view showing the structure of the SIMOX substrate after an STI trench is formed and illustrating the manufacture processes for the nonvolatile semiconductor memory device according to the first embodiment of the invention, the cross sectional view of FIG. 4 being taken along line A–A' shown in FIG. 1.

As shown in FIG. 4, the p-type semiconductor layer 5 is etched to expose the surface of the buried dielectric film 7, by using the left dielectric etching stopper film 8 as a mask 12.

For etching the p-type semiconductor layer 5, dry etching (reactive ion etching RIE) using a mixture gas as the etching gas is performed.

Under this etching condition, the p-type semiconductor layer 5 is etched until the surface of the buried dielectric film (oxide film) 7 is exposed. Under this etching condition, the etching automatically stops when the surface of the buried dielectric film (oxide film) 7 is exposed.

A plurality of trenches 11 extending in the row direction is therefore formed on the surface of the semiconductor substrate. Since the etching process automatically stops when the surface of the buried dielectric film (oxide film) 7 is exposed, the trench has generally the same thickness as that of the p-type semiconductor layer 5. The thickness of the p-type semiconductor layer 5 is generally uniform over the whole substrate area. The depth of the trench 11 formed by this etching process is generally uniform as measured from the substrate top surface.

Figure 5:
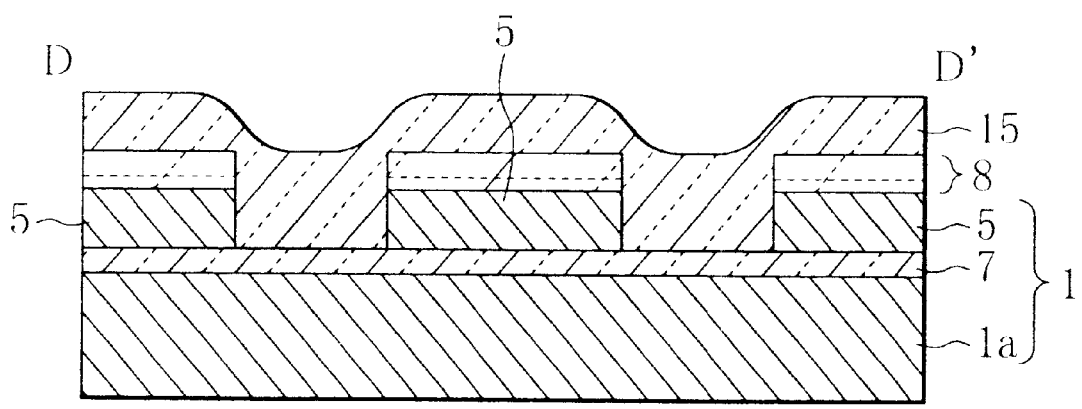
FIG. 5 is a cross sectional view showing the structure of the SIMOX substrate after a dielectric layer is deposited over the substrate and illustrating the manufacture processes for the nonvolatile semiconductor memory device according to the first embodiment of the invention, the cross sectional view of FIG. 5 being taken along line D–D' shown in FIG. 1.

As shown in FIG. 5, a dielectric oxide film 15 is deposited over the whole substrate surface by HD-PECVD (high density—plasma enhanced chemical vapor deposition). With HD-PECVD, a high quality oxide film can be deposited with excellent coverage of the trench 11 with the film even if the trench width is narrow.

After the dielectric film 15 is deposited, the surface of the dielectric film 15 is planarized by a chemical mechanical polishing method (CMP method). After the dielectric film 15 on the dielectric etching stopper film 8 is removed by CMP, the thermal oxidation film 8a and nitride film 8b (FIG. 4) used as a hard mask is removed by wet etching.

Figure 6:
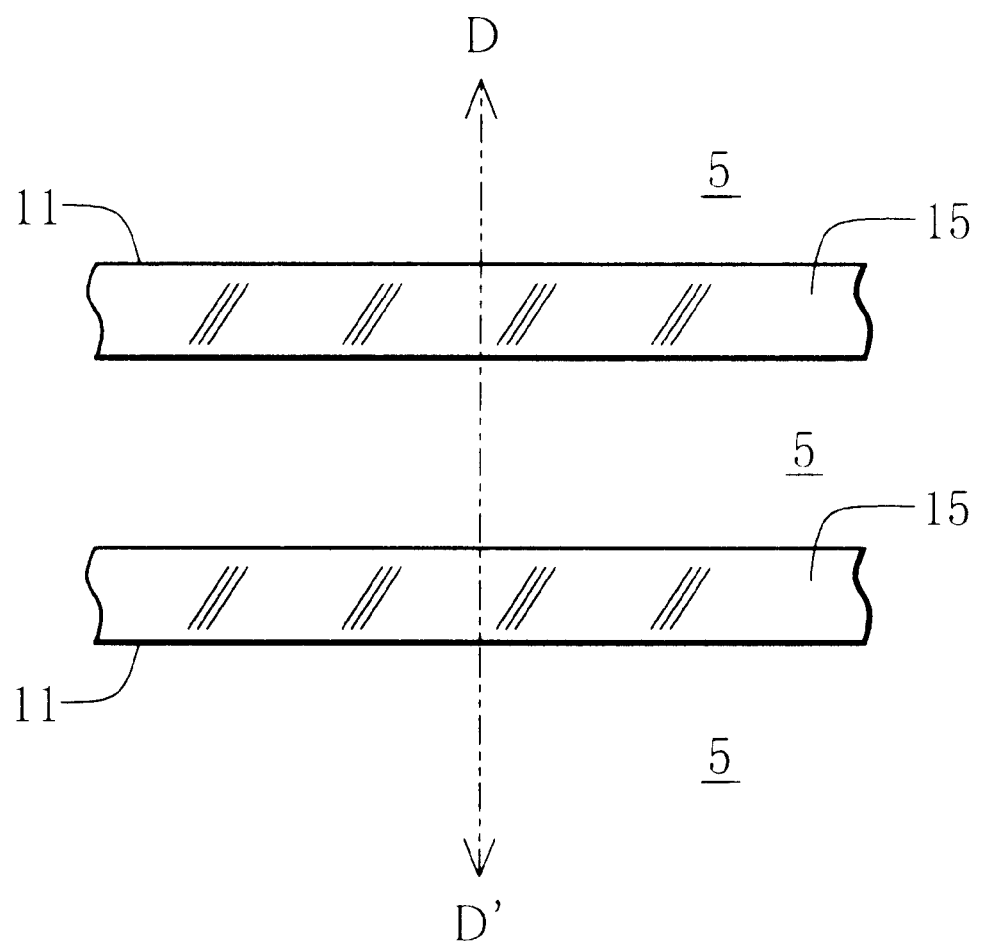
FIG. 6 is a plan view of an STI structure illustrating the manufacture process for the nonvolatile semiconductor memory device according to the first embodiment of the invention.
Figure 7:
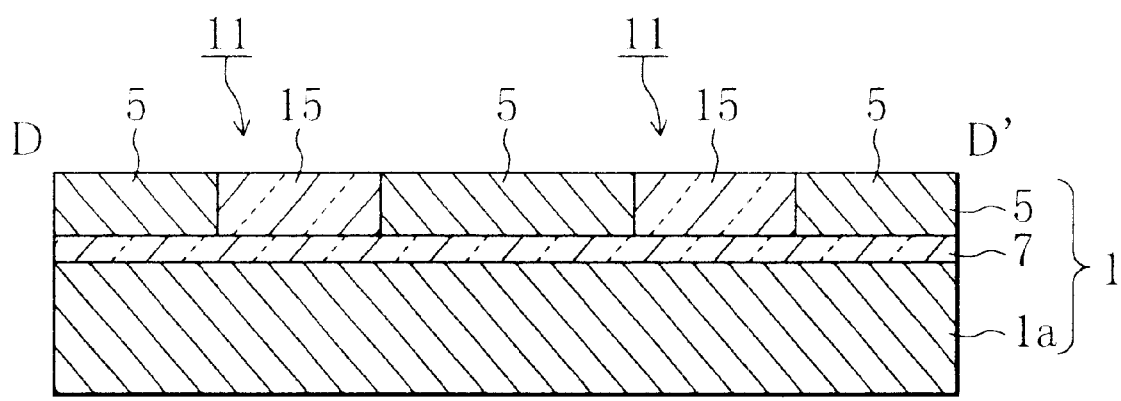
FIG. 7 is a cross sectional view of the STI structure illustrating the manufacture process for the nonvolatile semiconductor memory device according to the first embodiment of the invention, the cross sectional view of FIG. 7 being taken along line D–D' shown in FIG. 1.

As shown in FIGS. 6 and 7, the substrate 1 has an approximately flat surface, with the dielectric film 15 being filled in the trenches 11.

A plurality of trenches 11 filled with the dielectric film 15 extend in the row direction, and electrically separate p-type semiconductor layers 5 extending in the row direction between the trenches 11. In the depth direction of the substrate, the p-type semiconductor layer 5 is electrically separated from the p-type substrate portion 1a under the buried dielectric layer 7. In the above manner, a plurality of first conductivity type semiconductor layers 5 of a striped shape extending in the row direction are formed at a predetermined pitch in the column direction, which layers are dielectrically separated from each other. The above-described method of electrically separating active regions is called a shallow trench isolation (STI) method.

STI can form finer patterns than the active region separating method using LOCOS (Local Oxidation of Silicon).

Figure 8:
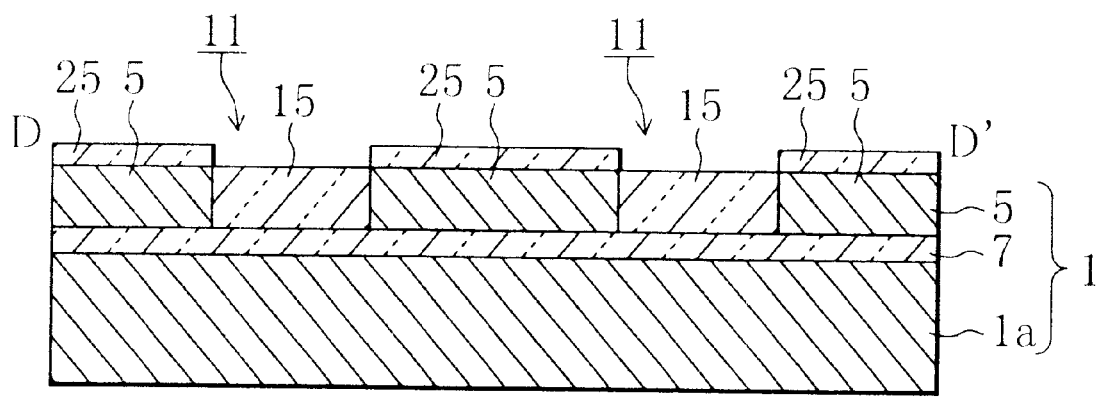
FIG. 8 is a cross sectional view showing the substrate structure after a first gate dielectric film is formed on a first conductivity type semiconductor layer and illustrating the manufacture process for the nonvolatile semiconductor memory device according to the first embodiment of the invention, the cross sectional view of FIG. 8 being taken along line D–D' shown in FIG. 1.

As shown in FIG. 8, a first gate dielectric film 25 of about 10 nm in thickness is formed on the surface of the semiconductor layer 5 by thermal oxidation. The thermal oxidation film is not formed on the surface of the dielectric film 15 filled in the trench 11, but selectively formed only on the surface of the first conductivity type semiconductor layer 5 formed in a striped shape.

Figure 9A:
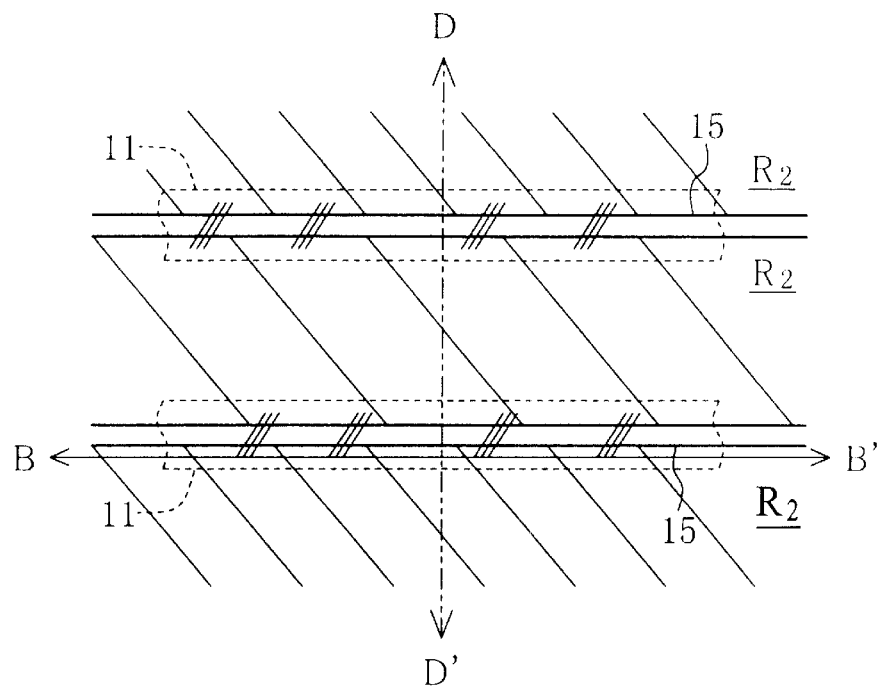
FIGS. 9A to 9C are a plan view and cross sectional views showing the substrate structure after a floating gate resist pattern is formed and illustrating the manufacture processes for the nonvolatile semiconductor memory device according to the first embodiment of the invention.
Figure 9B:
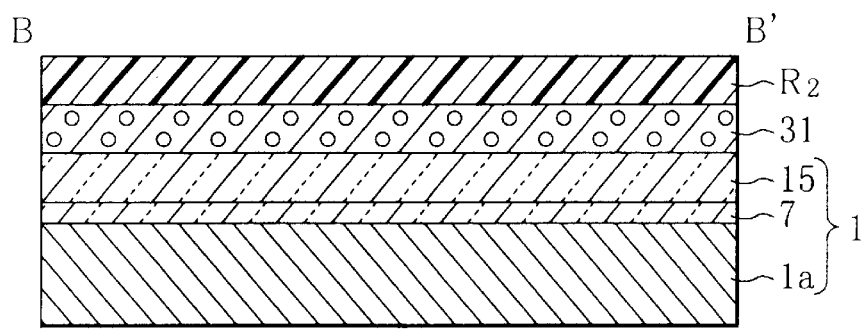
Figure 9C:
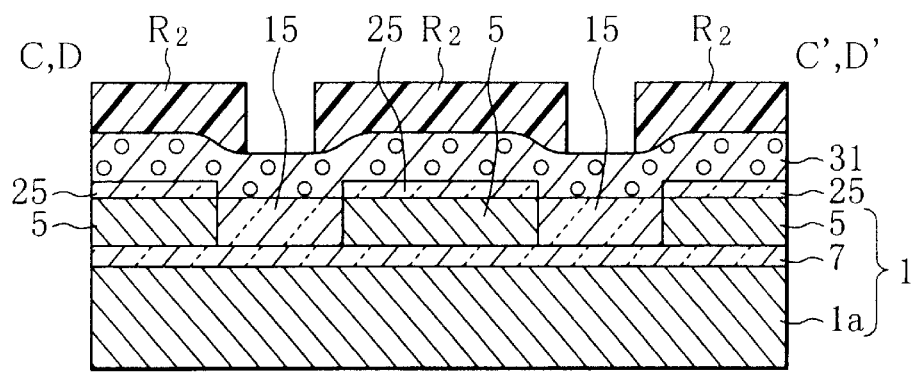

As shown in FIGS. 9A to 9C, a first polysilicon layer 31 is formed over the whole surface of the substrate 1, for example, to a thickness of about 90 nm by CVD. During this CVD process, n-type impurities P are doped into the first polysilicon layer 31, for example, to an impurity concentration of about $3\times10^{20}$ cm$^{-3}$. This impurity doping makes the first polysilicon layer 31 have a low resistivity.

As shown in FIGS. 9A to 9C, photoresist masks $R_2$ are formed on the first polysilicon layer 31 by known photolithography, extending in the row direction and separated in the column direction over the dielectric layers 15. By using these photoresist masks, the first polysilicon layer 31 is etched to expose the partial surfaces of the dielectric layers 15. First polysilicon layers 31 are therefore formed being separated in the column direction over the dielectric layers 15. Islands formed by the first polysilicon layer are disposed apart from each other in the row direction. Thereafter, the photoresist masks are removed.

Figure 10A:
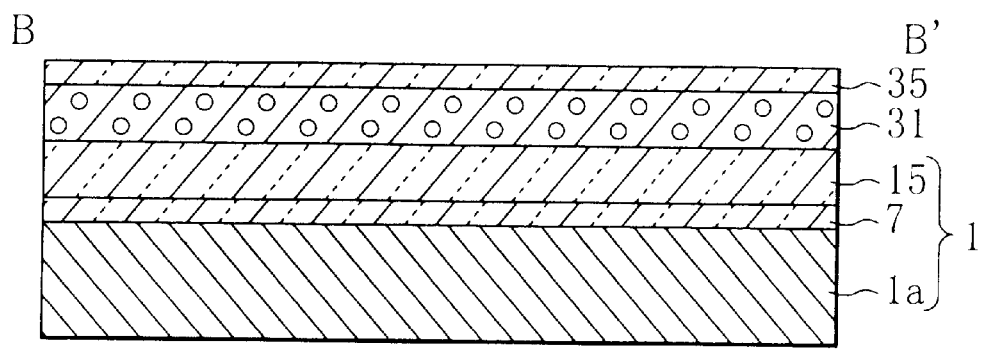
FIGS. 10A and 10B are cross sectional views showing the substrate structure after a first polysilicon layer and a second gate dielectric film are formed and illustrating the manufacture processes for the nonvolatile semiconductor memory device according to the first embodiment of the invention.
Figure 10B:
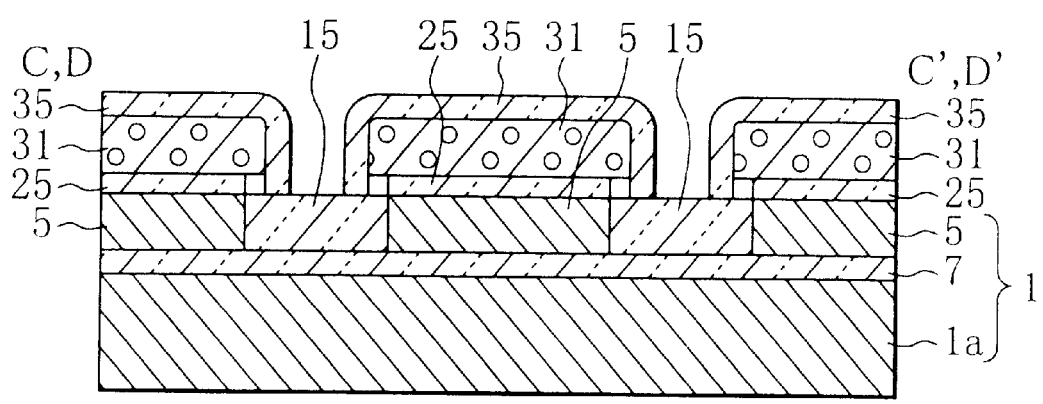

As shown in FIGS. 10A and 10B, second gate dielectric films 35 of oxide are grown on the surfaces of the first polysilicon layers 31 through thermal oxidation to a thickness of about 20 nm. The second gate dielectric film may be a single oxide layer or may have a stacked-layer structure such as oxide/nitride/oxide having a total thickness of about 20 nm. On the exposed surfaces of the first polysilicon layers 31 the second gate dielectric films 35 are selectively grown.

Figure 11A:
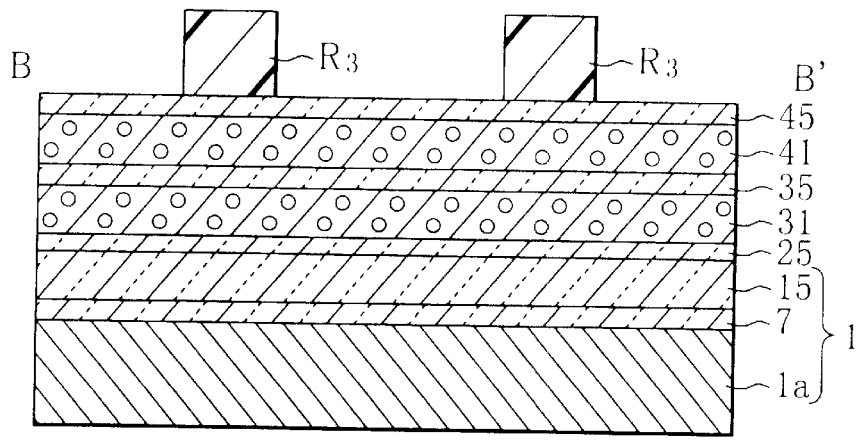
FIGS. 11A to 11C are cross sectional views showing th substrate structure after a second polysilicon layer and an antireflection film are formed and then a control gate resist pattern is formed and illustrating the manufacture processes for the nonvolatile semiconductor memory device according to the first embodiment of the invention.
Figure 11B:
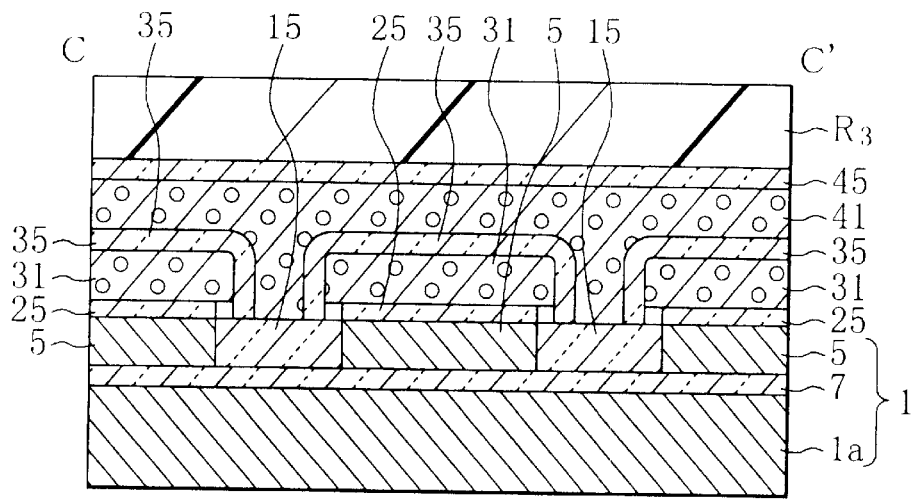
Figure 11C:
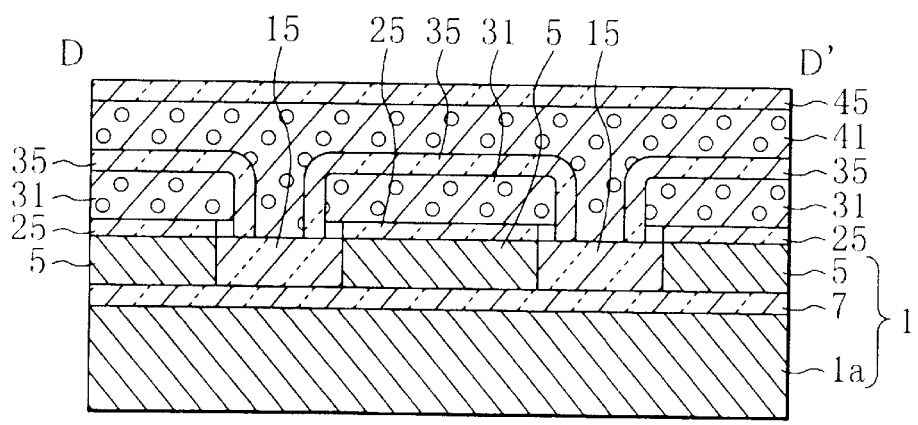

As shown in FIGS. 11A to 11C, a second polysilicon film 41 is grown over the whole substrate surface to a thickness of about 120 nm by CVD. During this CVD process, n-type impurities P are doped into the second polysilicon film 41, for example, to an impurity concentration of about $1 \times 10^{20}$ cm$^{-3}$. This impurity doping makes the second polysilicon film 41 have a low resistivity. An antireflection film 45 is formed on the second polysilicon film 41 to a thickness of about 100 nm, the antireflection film 45 being made of SiON and used later as an etching stopper film during a self-aligned source (SAS) forming process. With the processes described so far, on the SIMOX substrate 1 having active regions electrically separated in the column direction, the first gate dielectric film 25, first polysilicon film 31, second gate dielectric film 35, second polysilicon film 41 and antireflection film 45 are sequentially formed.

As shown in FIG. 11A, resist masks $R_3$, for forming control gates are formed by ordinary photolithography. By using the resist masks $R_3$, $R_3$, the antireflection film 45, second polysilicon layer 41, second gate dielectric layer 35, first polysilicon film 31, and first gate dielectric film 25 are sequentially etched.

Figure 12A:
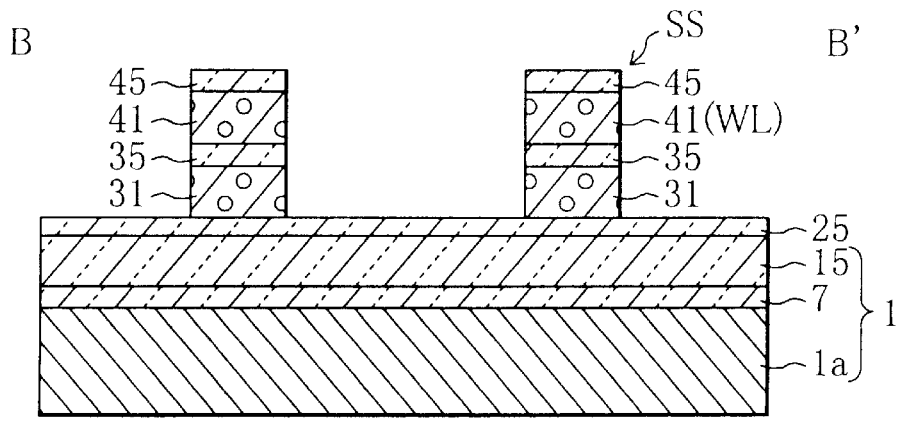
FIGS. 12A to 12C are cross sectional views showing the substrate structure after a control gate is etched to form a stacked-layer structure and illustrating the manufacture processes for the nonvolatile semiconductor memory device according to the first embodiment of the invention.
Figure 12B:
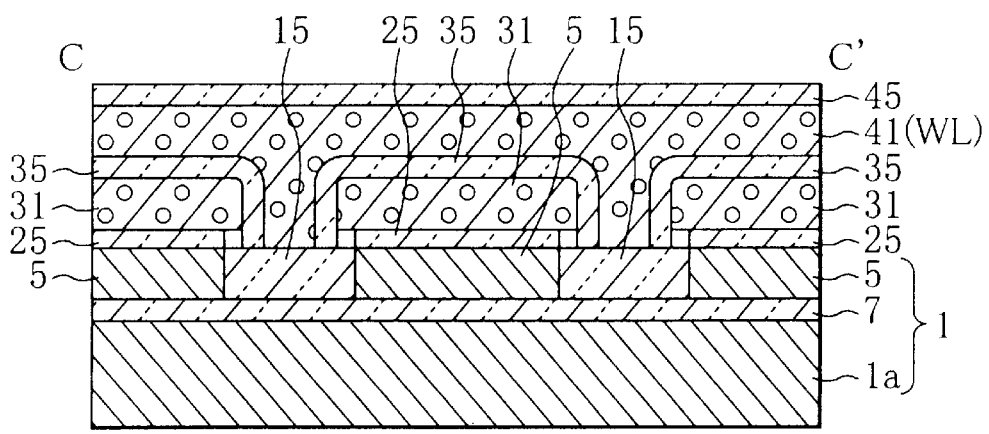
Figure 12C:
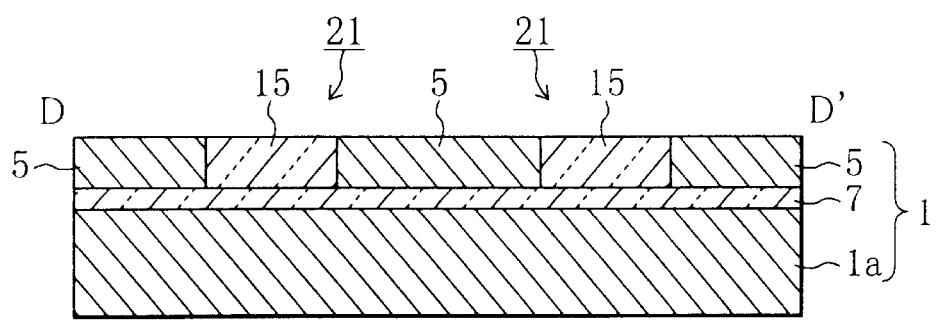

FIGS. 12A to 12C are cross sectional views of the substrate after the etching process. As shown in FIGS. 12A and 12B, a stacked-layer structure SS is formed which is constituted of the antireflection film 45, second polysilicon film 41, second gate dielectric film 35 and first polysilicon film 31. A plurality of control gates CG made of the second polysilicon film 41 and a plurality of floating gates FG made of the first polysilicon film 31 are formed having a striped shape extending in the column direction. The floating gates FG are formed being intermittently disconnected in the column direction, and the control gates CG are formed continuously in the column direction, constituting the word lines WL.

As shown in FIG. 11C, the antireflection film 45 is not covered with the resist masks $R_3$ in the cross sectional view taken along line D–D' of FIG. 1. Therefore, as shown in FIG. 12C, the stacked-layer structure SS constituted of the antireflection film 45, second polysilicon film 41, second gate dielectric film 35, first polysilicon film 31 and first gate dielectric film 25 is completely etched. On the exposed surface, the first semiconductor layer 5 and a buried dielectric layer 21 filled with the dielectric layer 15 are disposed alternately.

Figure 13A:
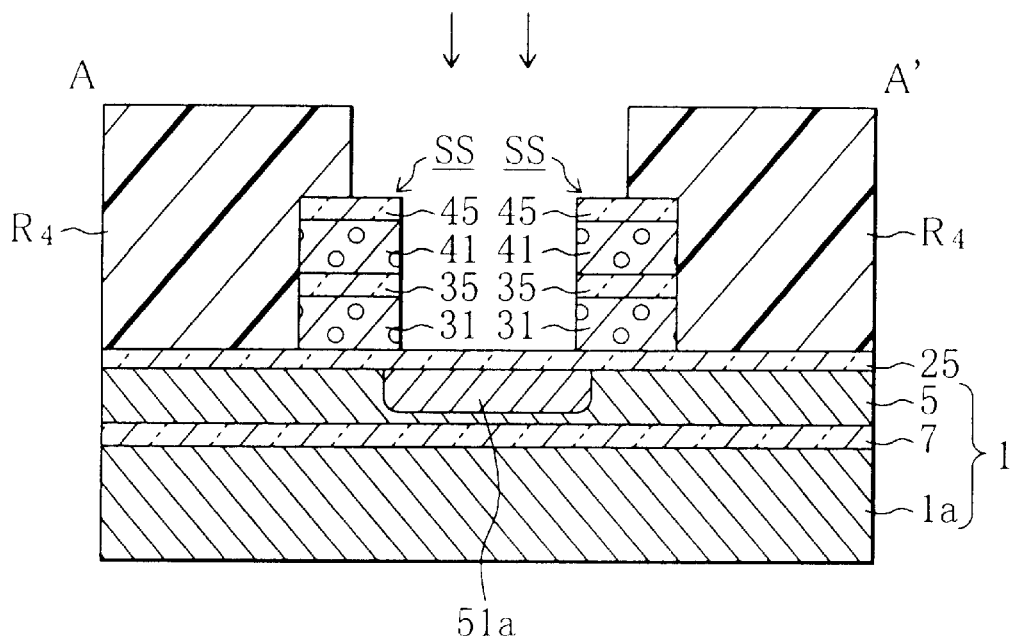
FIGS. 13A and 13B are cross sectional views showing the substrate structure after a second conductivity type lightly doped layer is formed in the source region and illustrating the manufacture processes for the nonvolatile semiconductor memory device according to the first embodiment of the invention.
Figure 13B:
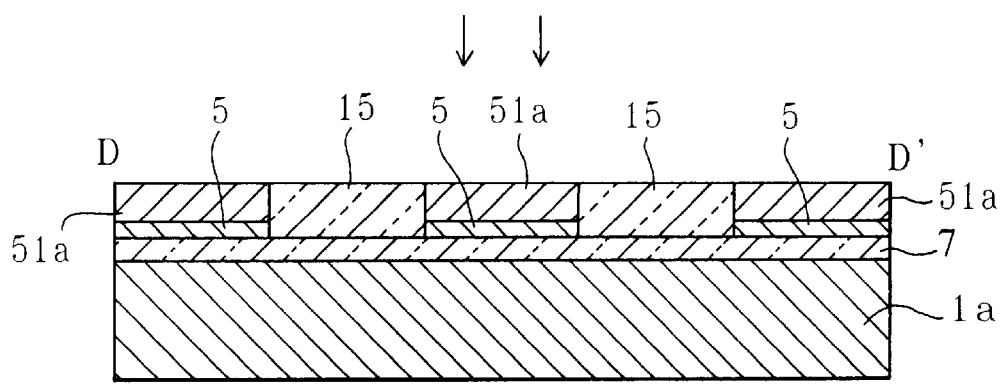

As shown in FIGS. 13A and 13B, photoresist masks $R_4$ are formed by ordinary photolithography. The photoresist masks $R_4$ are formed so that they cover at least the surfaces of the substrate 1 on the outer sides (drain region sides) of the stacked-layer structures SS constituted of the antireflection film 45, second polysilicon film 41, second gate dielectric film 35, first polysilicon film 31 and first gate dielectric film 25. By using impurity doping techniques such as ion implantation, impurities of the second conductivity type are selectively introduced at a relatively low concentration into the first conductivity type semiconductor regions 5 between the adjacent two stacked-layer structures SS. Lightly doped layer 51a are formed. Thereafter, the photoresist masks $R_4$ are removed. For example, if impurities are to be introduced by ion implantation, P$^+$ ions are implanted under the conditions of acceleration energy of 50 to 60 keV and a dose of 2 to $4 \times 10^{14}$ cm$^{-2}$.

Figure 14A:
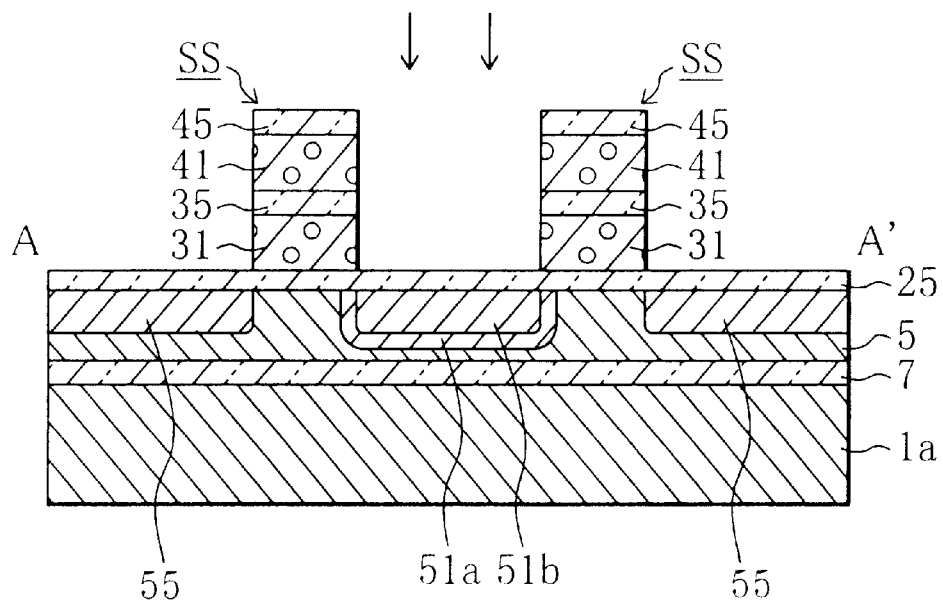
FIGS. 14A and 14B are cross sectional views showing the substrate structure after a second conductivity type highly doped layer is formed in the source and drain regions and illustrating the manufacture processes for the nonvolatile semiconductor memory device according to the first embodiment of the invention.
Figure 14B:
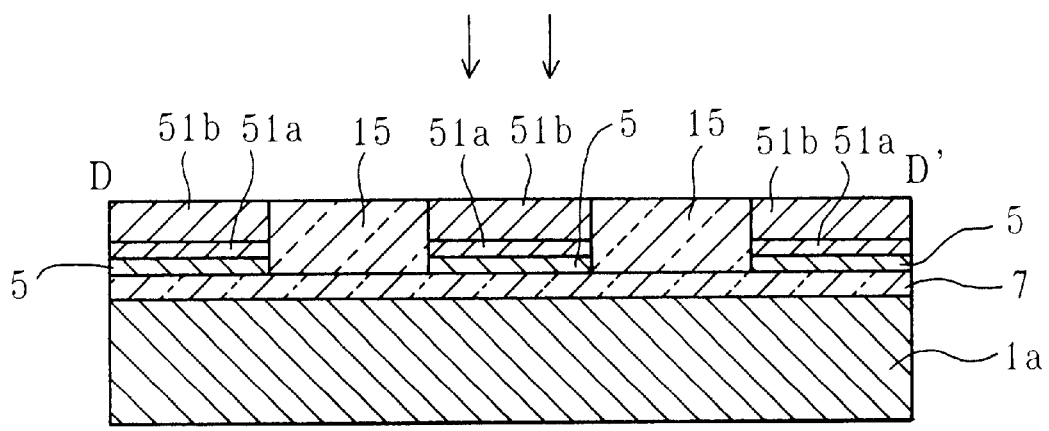

As shown in FIGS. 14A and 14B, by using as a mask the stacked-layer structures SS constituted of the antireflection film 45, second polysilicon film 41, second gate dielectric film 35 and first polysilicon film 31 and by using ion doping techniques such as ion implantation, impurities of the second conductivity type are introduced into the first conductivity type semiconductor regions 5 to a high concentration.

As shown in FIG. 14A, in the region between the stacked-layer structures SS, an n-type lightly doped layer 51a and an n-type highly doped layer 51b are formed. The n-type lightly doped layer 51a surrounds the n-type highly doped layer 51b to form a source region. On the outer sides of the stacked-layer structures SS, n-type impurities are introduced to a high concentration to form a drain region 55.

The n-type lightly doped layer 51a and n-type highly doped layer 51b are formed in self-alignment with the stacked-layer structure SS constituted of the antireflection film 45, second polysilicon film 41, second gate dielectric film 35 and first polysilicon film 31. A parasitic resistance between the source and gate can be lowered.

As shown in the cross sectional view of FIG. 14B taken along line D–D' of FIG. 1, on the buried dielectric film 7, a three-layer structure including the first semiconductor layer 5, n-type lightly doped layer 51a and n-type highly doped layer 51b, and the insulating layer 15, are alternately disposed in the column direction.

Impurities are introduced by ion implantation. The n-type highly doped layer 51b is formed, for example, by implanting As$^+$ ions under the conditions of an acceleration energy of 50 to 60 keV and a dose of 5 to $7 \times 10^{15}$ cm$^{-2}$.

As a heat treatment after the ion implantation, rapid thermal annealing (RTA) is used. For example, the thermal annealing process is performed for 10 to 20 seconds at 1000° C. in a nitrogen gas atmosphere.

Figure 15A:
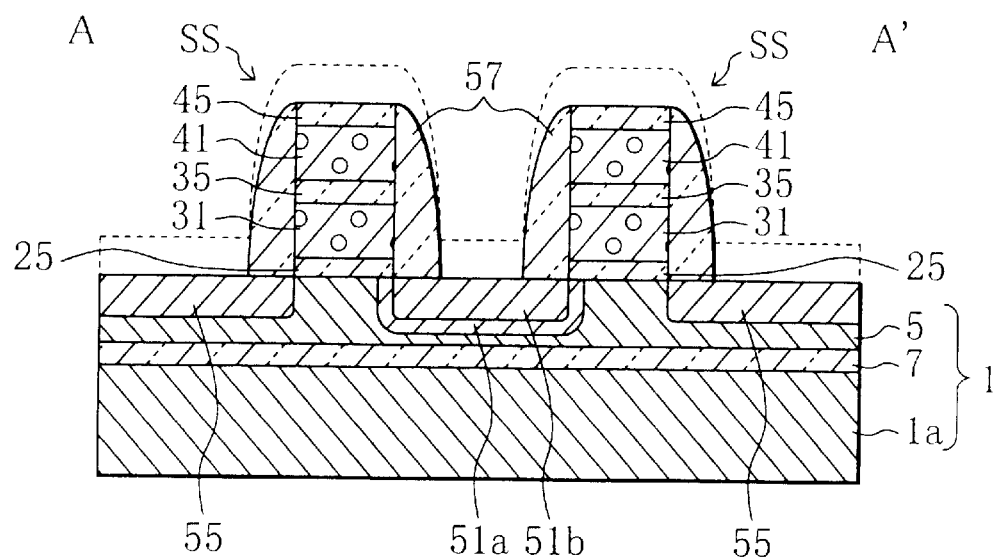
FIGS. 15A and 15B are cross sectional views showing the substrate structure after side wall spacers are formed on both side walls of the stacked-layer structure and illustrating the manufacture processes for the nonvolatile semiconductor memory device according to the first embodiment of the invention.
Figure 15B:
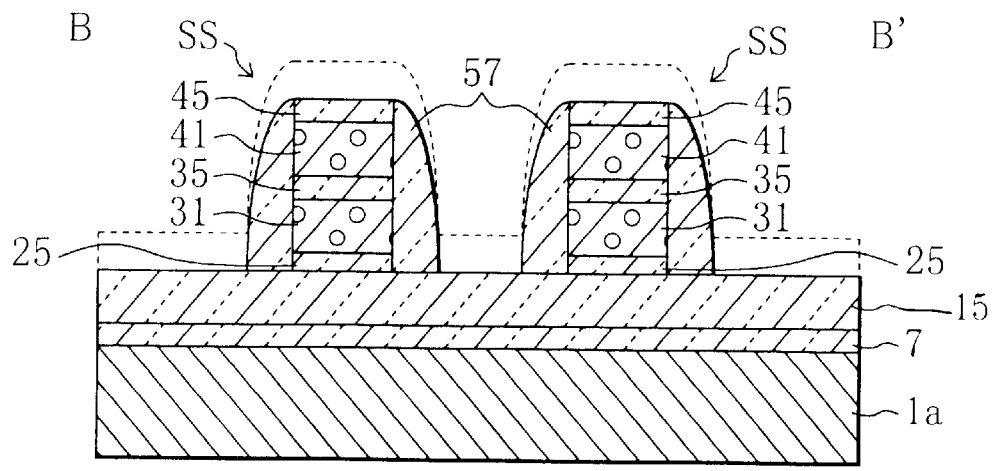

An oxide film is grown over the whole substrate surface to a thickness of about 100 nm by CVD, as indicated by broken lines in FIGS. 15A and 15B. The whole surface of the oxide film is then etched by anisotropical etching.

As shown in FIGS. 15A and 15B, dielectric side wall spacers are left on the side walls of the stacked-layer structure SS.

Figure 16A:
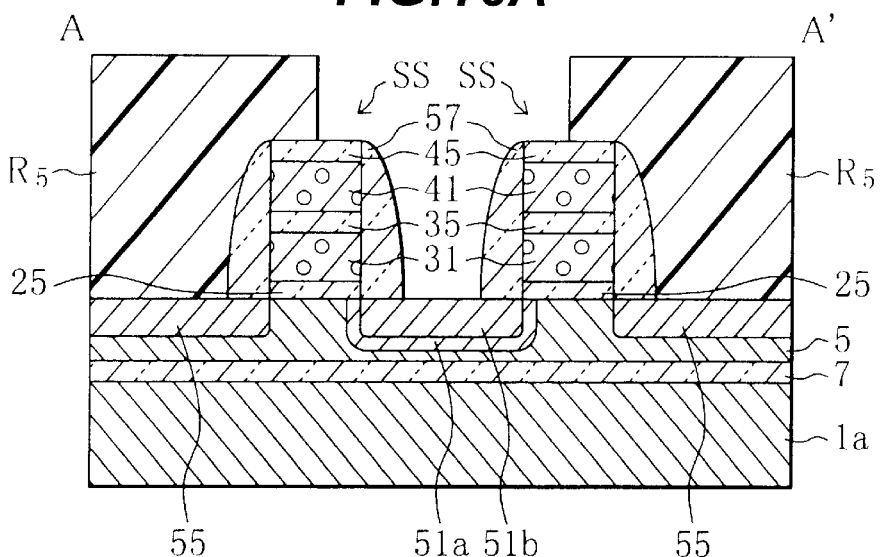
FIGS. 16A to 16C are cross sectional views showing the substrate structure after an STI dielectric layer and a buried dielectric film continuous with the source region in the column direction are removed and illustrating the manufacture processes for the nonvolatile semiconductor memory device according to the first embodiment of the invention.
Figure 16B:
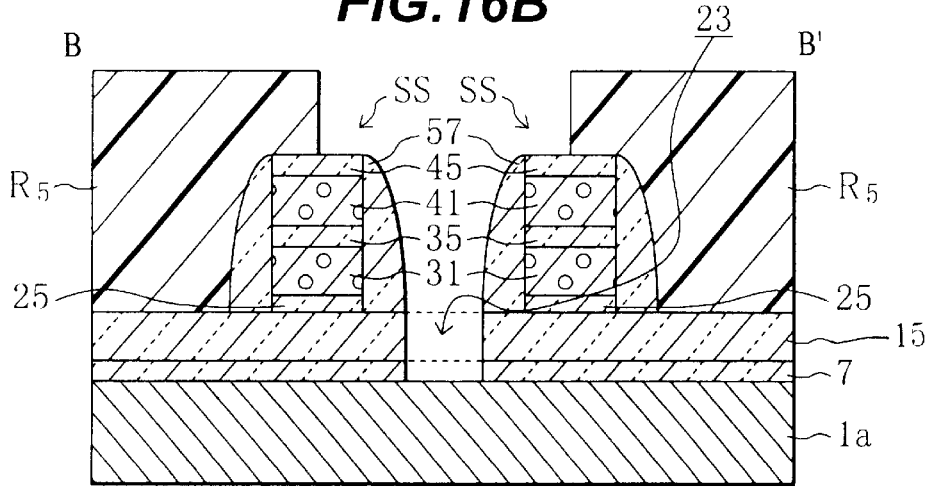
Figure 16C:
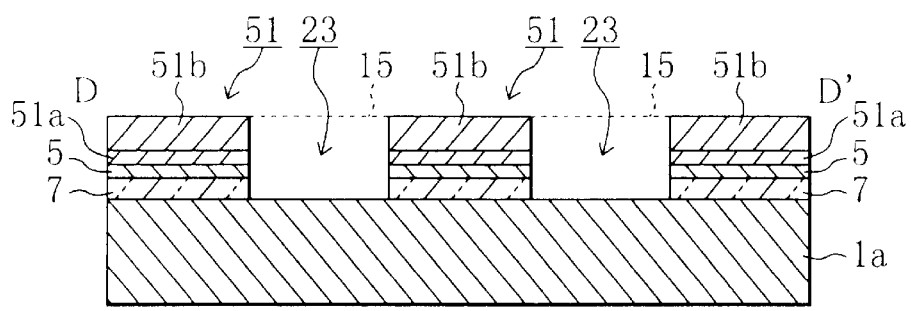

As shown in FIGS. 16A to 16C, photo resist patterns $R_5$ are formed by ordinary photolithography. The photo resist patterns $R_5$ are formed so that they cover at least the surfaces of the substrate 1 in the outer (drain) regions of the stacked-layer structures SS.

By using as a mask the photoresist patterns $R_5$ stacked-layer structures SS and dielectric side wall spacer layers 57, the dielectric layer 15 and buried dielectric film 7 are dry-etched.

As shown in FIGS. 16A to 16C, with this dry etching, semiconductor layers such as the n-type highly doped layer 51b and substrate 1a are not etched, but the dielectric layer of oxide is selectively etched. Etching the insulating film 15 filled in the trench 11 between the control gates CG (41) forming the word lines stops when the surface of the semiconductor layer 1a is exposed.

As shown in FIG. 16B, with this dry etching, the dielectric layer 15 and buried oxide film 7 between the stacked-layer structures SS are removed and an opening 23 is formed. The surface of the semiconductor substrate 1a is exposed at the bottom of the opening 23. In the cross sectional view of FIG. 16C taken along line D–D' of FIG. 1, convex source regions 51 and concave openings 23, 23 are alternately disposed in the column direction.

After the photoresist patterns are removed, silicon is grown at a low temperature of 950° C. or lower by using gas such as $SiH_2Cl_2$ and $Si_2H_6$.

Figure 17A:
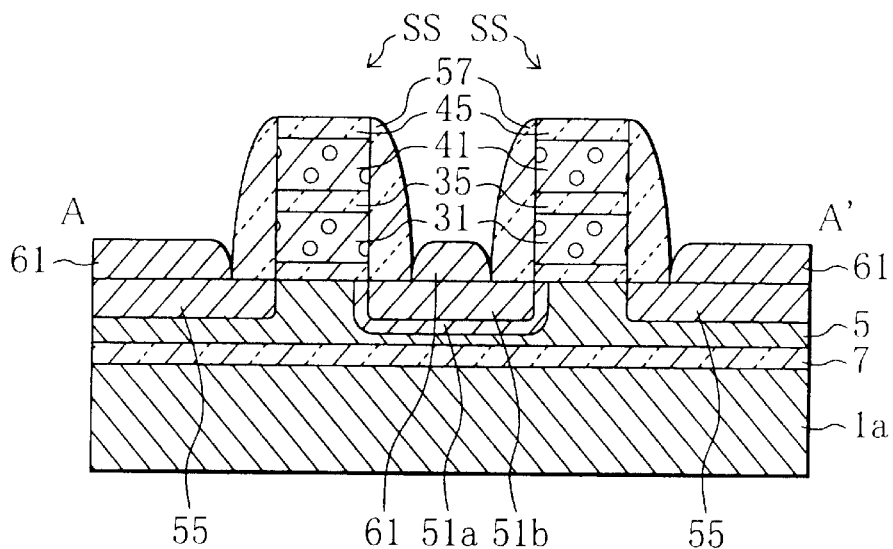
FIGS. 17A to 17C are cross sectional views showing the substrate structure after a semiconductor layer is selectively grown on an exposed semiconductor surface and illustrating the manufacture processes for the nonvolatile semiconductor memory device according to the first embodiment of the invention.
Figure 17B:
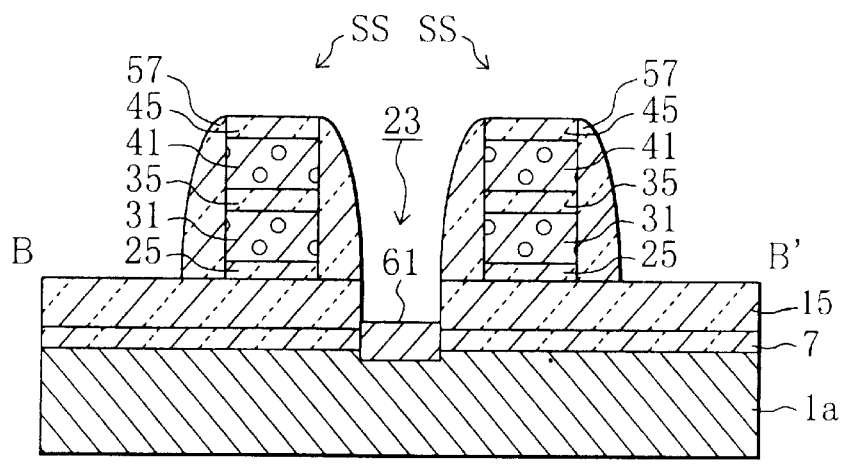
Figure 17C:
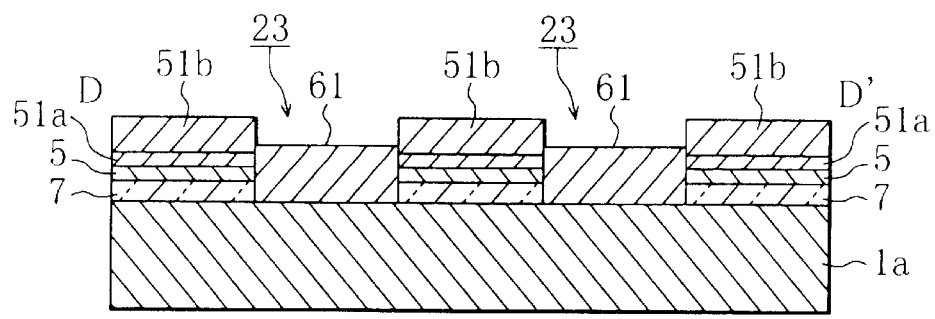

As shown in FIGS. 17B and 17C, silicon layers 61 are grown on the surfaces of the semiconductor layer 1a exposed at the bottoms of the openings 23 by the dielectric layer etching process. The silicon layers are also grown on the other exposed surfaces of the semiconductor layer. Namely, the silicon layers 61 are selectively grown on the exposed semiconductor layer.

As shown in FIGS. 178 and 17C, the silicon layers 61 grown on the concave openings 23 adjacent to the source regions 51 between the stacked-layer structures have a thickness of about 100 nm. The silicon layers 61 are in contact with the second conductivity type semiconductor layers 51a, 51b at least at their side walls.

As shown in FIG. 17A, the silicon layers 61 are also grown on the source and drain regions.

Figure 18A:
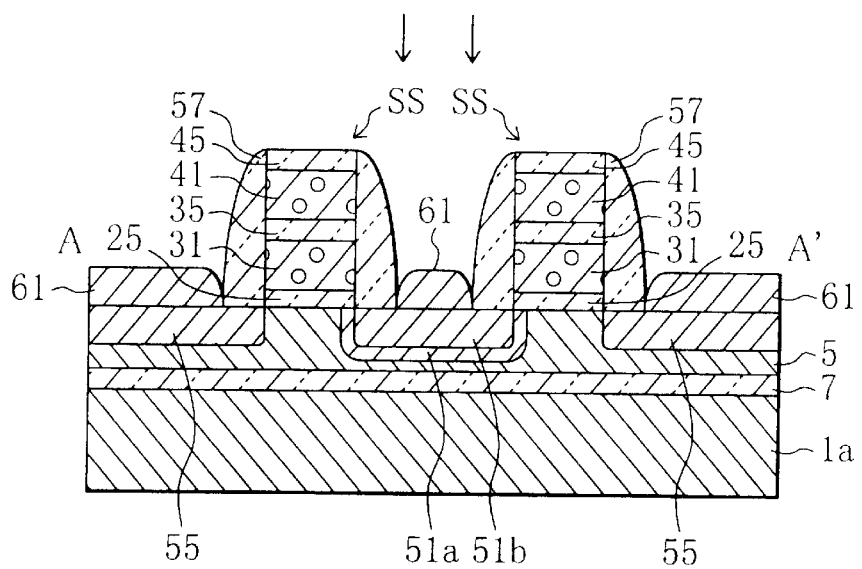
FIGS. 18A to 18C are cross sectional views showing the substrate structure after second conductivity type impurities are implanted into the selectively grown semiconductor region and illustrating the manufacture processes for the nonvolatile semiconductor memory device according to the first embodiment of the invention.
Figure 18B:
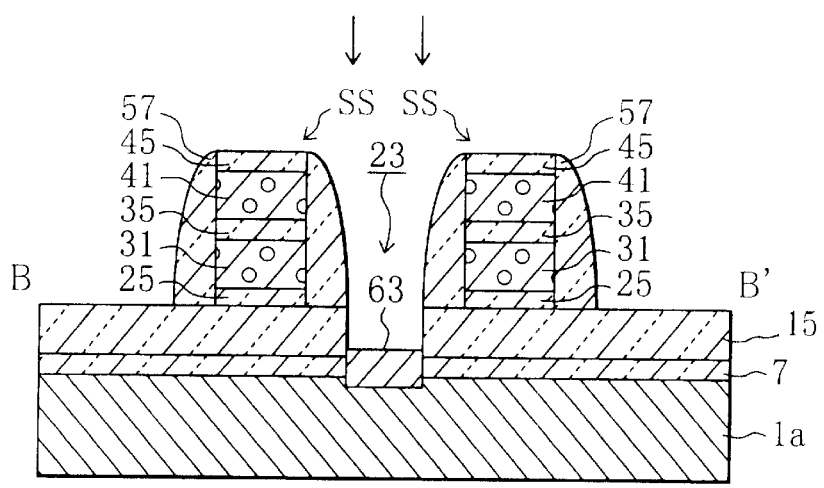
Figure 18C:
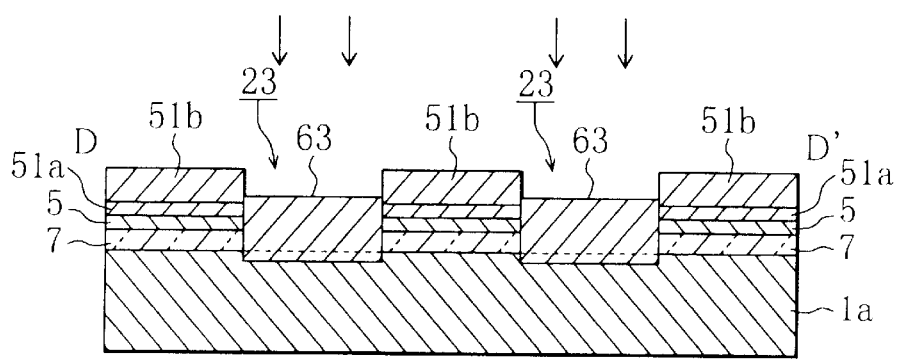

As shown in FIGS. 18A to 18C, second conductivity type impurities As are introduced into the grown silicon layers 61 by ion implantation.

As shown in FIGS. 18B and 18C, the impurities As are introduced into the silicon semiconductor layers 61 along the direction toward the substrate 1. The silicon semiconductor layer 61 forms a second conductivity type semiconductor layer. The second conductivity type semiconductor layer formed in the concave opening 23 by introducing As is called a semiconductor layer 63 for connecting source regions.

The source region connecting semiconductor layers 63 are in contact with both side walls of the adjacent convex source regions 51 in the openings 23. The convex source regions 51 alternately disposed in the column direction are therefore electrically connected to the source region connecting semiconductor layers in the openings 23. The source region connecting semiconductor layer 63 makes a step to be formed between the convex source region 51 and concave opening 23 lower.

As shown in FIGS. 19A to 19D, the SiON layer 45 on the control gate 41 is etched and removed to expose the upper surface of the control gate 41. A conductive layer of Ti is deposited over the whole substrate surface to a thickness of about 30 nm. Of the Ti conductive layer 71, Ti on the source region 51, drain region 55, source region connecting semiconductor layer 63 and control gate 41 is in direct contact with the silicon layer (including polysilicon).

A heat treatment is performed for 90 seconds at 700° C. in an $N_2$ atmosphere by RTA. With this heat treatment, the Si semiconductor layer and Ti layer in direct contact react with each other to form a silicide layer 71a made of metal TiSi.

Of the Ti conductive layer 71, Ti on the dielectric side wall spacer films 57 and dielectric layer 15 in the trench 11 not in direct contact with the silicon layer will not react with the dielectric film even during the RTA heat treatment and is left as unreacted metal Ti.

Figure 19A:
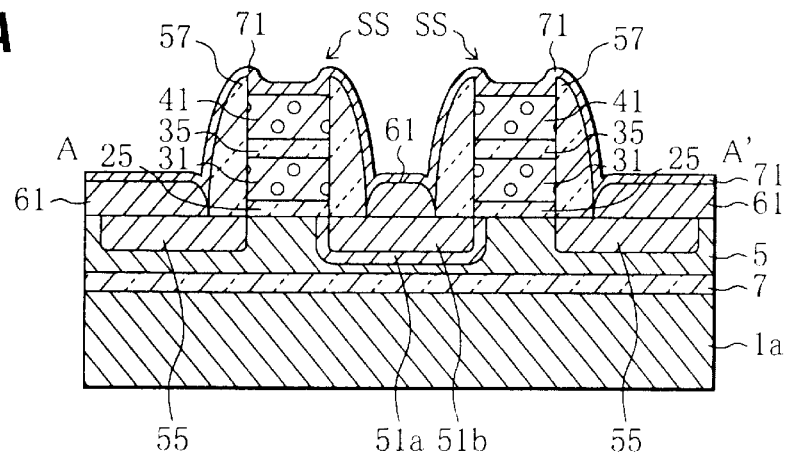
FIGS. 19A and 19D are cross sectional views showing the substrate structure after a Ti layer is vapor-deposited over the whole substrate surface and illustrating the manufacture processes for the nonvolatile semiconductor memory device according to the first embodiment of the invention.
Figure 19B:
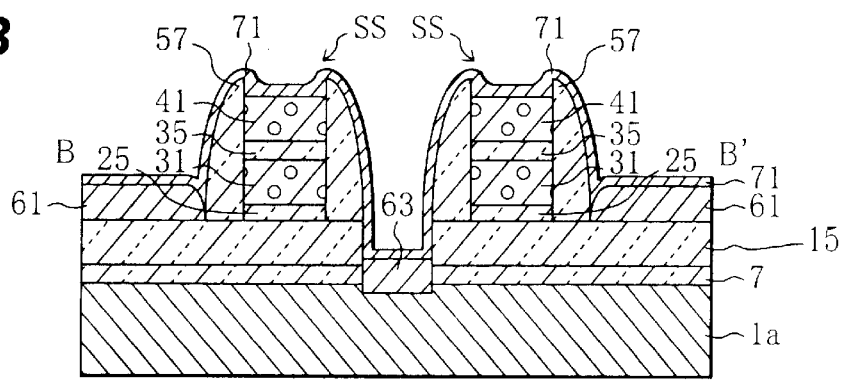
FIG. 19B is the cross sectional view taken along line B–B' shown in FIG. 1.
Figure 19C:
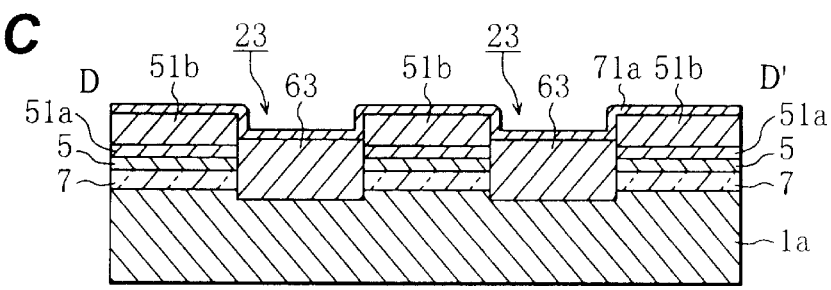
FIG. 19C is the cross sectional view taken along line D–D' shown in FIG. 1
Figure 19D:
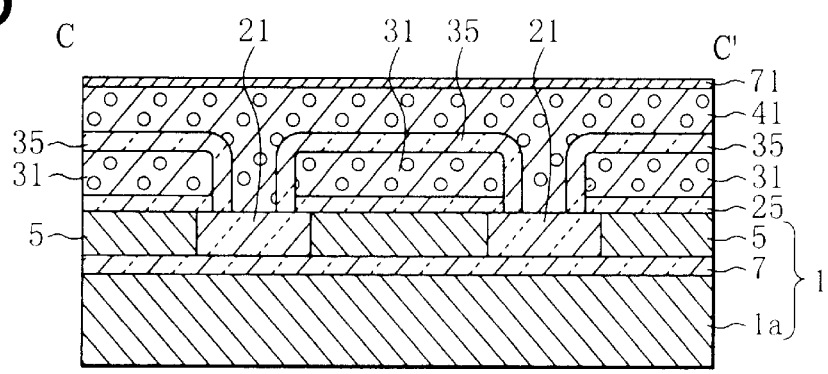

As shown in FIG. 19C, the metal silicide layer of TiSi is therefore formed on the upper and side walls of the source regions 51 disposed in the column direction and on the upper surface of the source region connecting semiconductor layer 63.

As shown in FIGS. 20A to 20D, the whole substrate surface is etched to remove the unreacted Ti. The metal silicide layer 71a of TiSi formed by reacting with Si during the heat treatment is left on the semiconductor layer.

A heat treatment is again performed for 30 seconds at 800° C. in an Ar atmosphere. Silicification of the TiSi layer further progresses so that the resistivity of the TiSi layer lowers further.

Figure 20A:
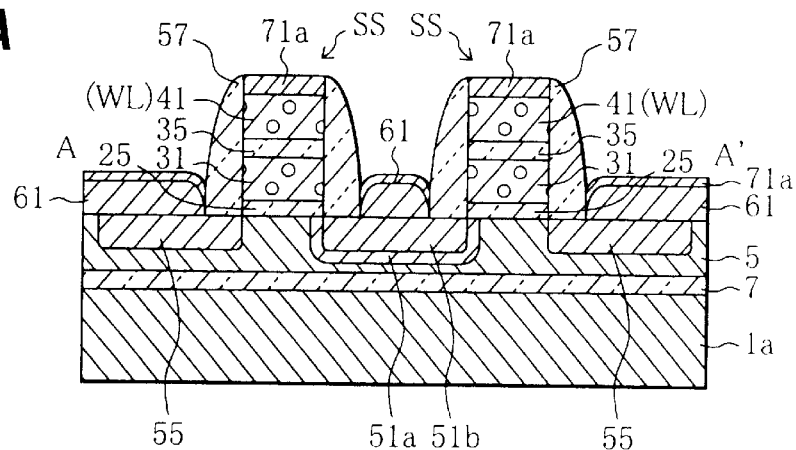
FIGS. 20A to 20D are cross sectional views showing the substrate structure after an unreacted Ti layer is removed after a heat treatment and illustrating the manufacture processes for the nonvolatile semiconductor memory device according to the first embodiment of the invention.
Figure 20B:
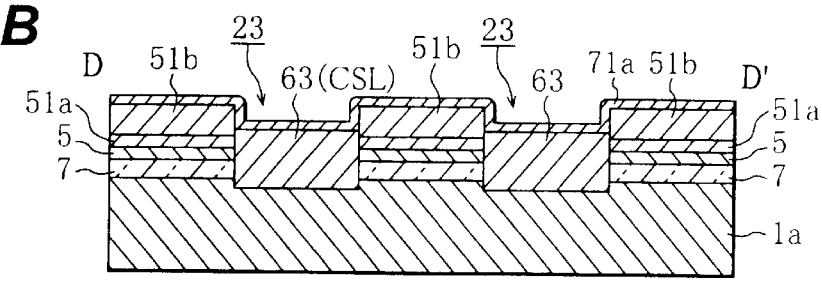
Figure 20C:
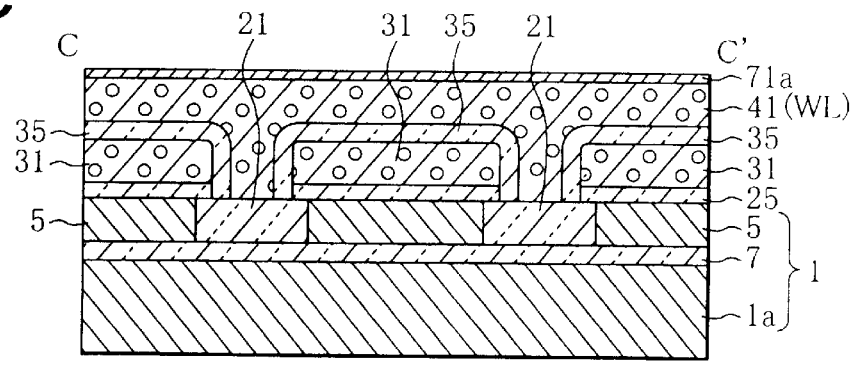

As shown in FIGS. 20B and 20C, the source regions 51 adjacent in the column direction are electrically connected, by direct contact between the semiconductor layers 51a and 51b and source region connecting semiconductor layer 63, and via the conductive layer 71a.

As described earlier, the source region connecting semiconductor layer 63 is buried in the concave opening 23 (FIGS. 18B and 18C) so that the step between the convex source region 51 and concave opening 23 is made low. Disconnection of the metal silicide layer 71a of TiSi at the step can be prevented. The source regions are electrically connected in the column direction to form a common source line CSL. Both the word line WL and common source line CSL extend on the substrate in the column direction.

Figure 20D:
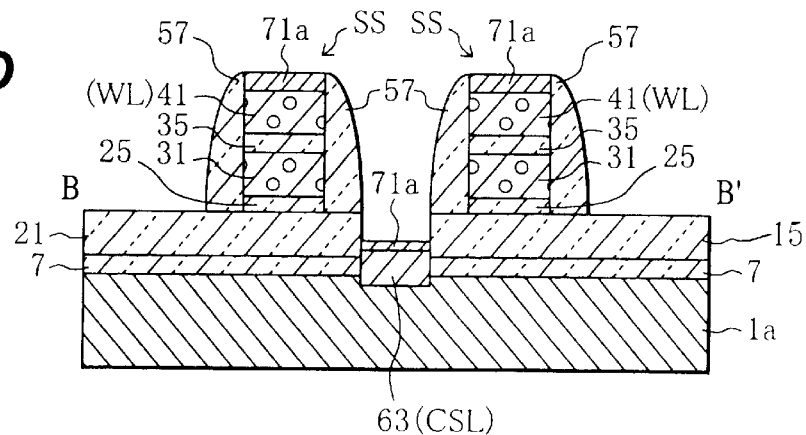
Figure 21A:
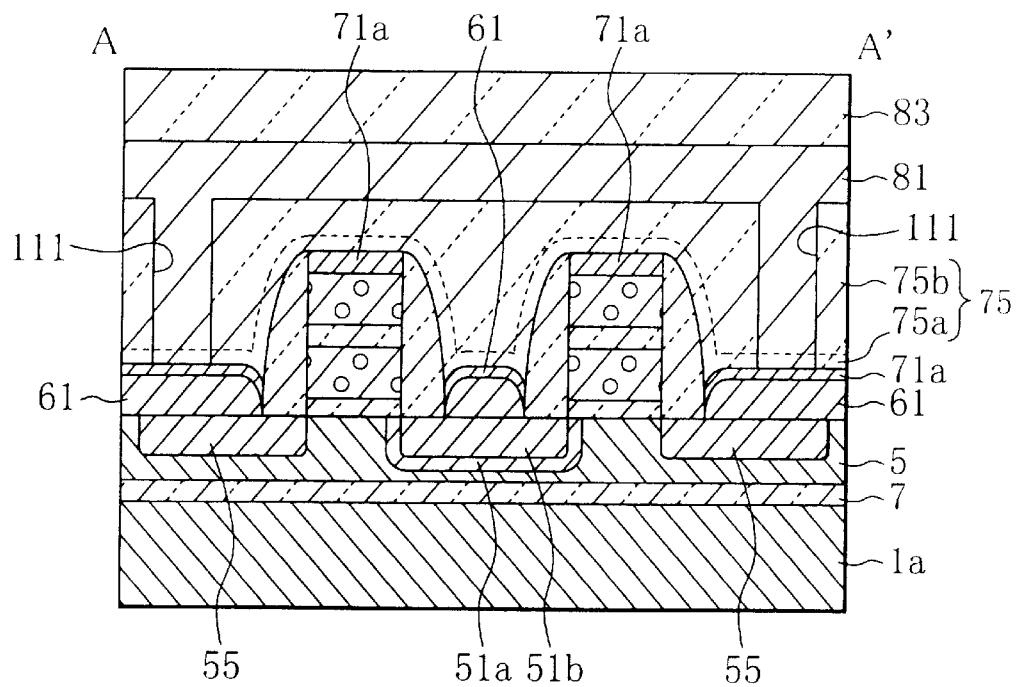
FIGS. 21A and 21B are cross sectional views showing the substrate structure after an interlayer dielectric film, an upper wiring layer and a passivation film are formed and illustrating the manufacture processes for the nonvolatile semiconductor memory device according to the first embodiment of the invention.
Figure 21B:
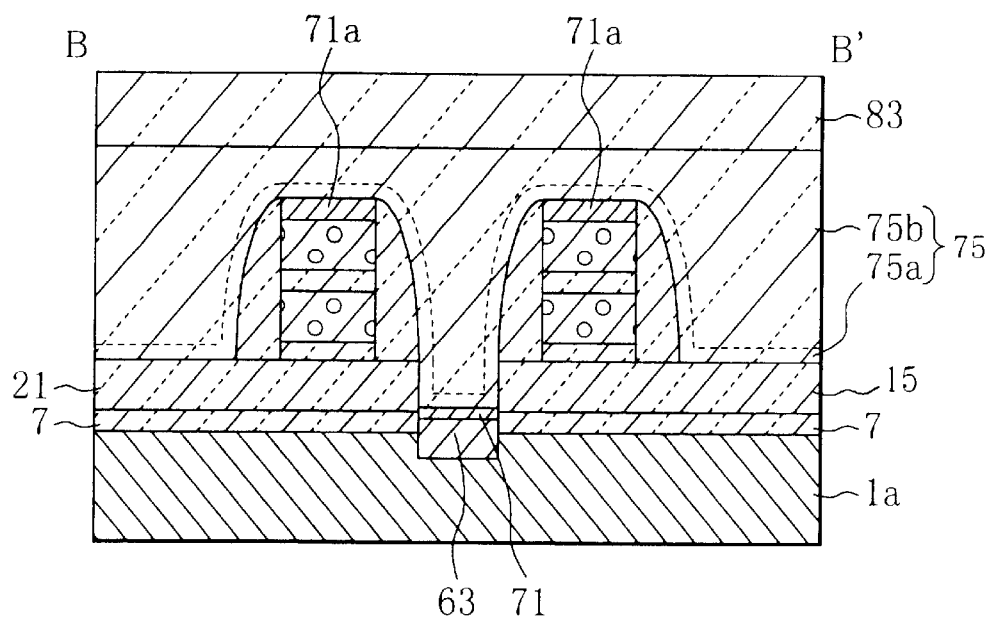
Figure 22A:
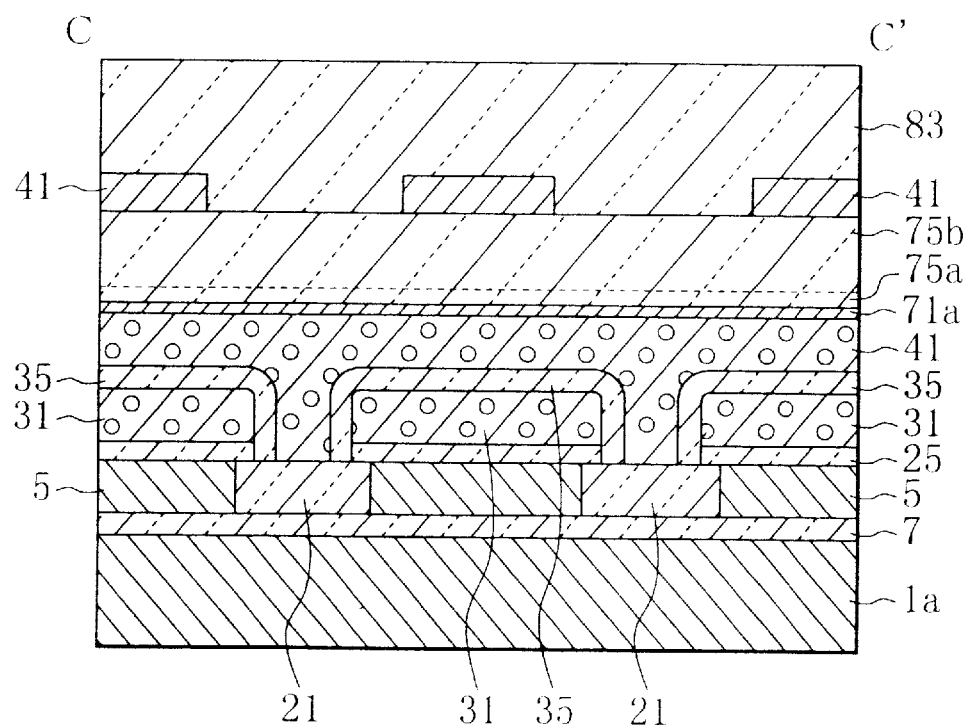
FIGS. 22A and 22B are cross sectional views showing the substrate structure after the interlayer dielectric film, upper wiring layer and passivation film are formed and illustrating the manufacture processes for the nonvolatile semiconductor memory device according to the first embodiment of the invention.
Figure 22B:
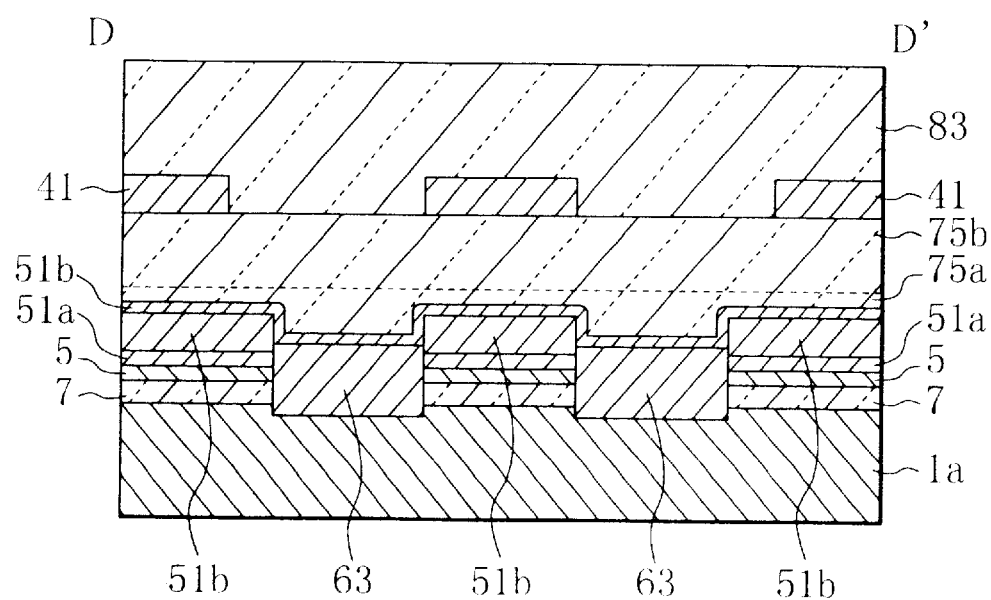

As shown in FIGS. 20A and 20D, since the metal silicide layer 71a of TiSi is formed on the second polysilicon layer 41 of the control gate, the sheet resistance of the control gate lowers. Since the metal suicide layer 71a of TiSi is also formed on the drain region 61, the sheet resistance of the drain region 61 lowers.

Since the dielectric side wall spacers 57 are formed on the side walls of the stacked-layer structure SS, the metal silicide layer 71a on the source region connecting semiconductor layer 63 and drain region 61 can be formed in a self alignment manner relative to the side walls of the stacked-layer structure. Resistances of the source, drain and gate can be lowered.

A process of forming the metal suicide layer 71a made of TiSi or the like in a self alignment manner relative to the stacked-layer structure SS or gates is called a salicide (self-aligned silicide) process.

As shown in FIGS. 21A and 21B and FIGS. 22A and 22B, a silicon oxide film 75a is formed on the whole substrate surface to a thickness of 100 nm, and on this silicon oxide film 75a, a borophosphosilicate glass (BPSG) film 75b is deposited and reflowed to planarize the irregular surface thereof and form an interlayer insulation film having a flat surface.

The interlayer insulation film is etched to form contact holes 111 therethrough at areas corresponding to the drain regions 55. An upper wiring layer 81 of Al for connecting a plurality of drain regions via the contact holes 111 in the row direction is formed. The upper wiring layer 81 is used as a bit line (BL) of the nonvolatile semiconductor memory device.

A passivation film 83 of SiN or SiON is formed on the BPSG film 75b and upper wiring layer 81.

With the above processes, the nonvolatile semiconductor memory device M shown in FIGS. 21A to 22B can be formed.

In the embodiment described above, although the semiconductor layers 51a and 51b are in direct contact with the source region connecting semiconductor layer 63, the semiconductor layers 51a and 51b may use the structure not in direct contact with the source region connecting semiconductor layer 63. In this case, the semiconductor layers 51a and 51b are electrically connected via the conductive layer 71a to form the common source region.

Figure 23:
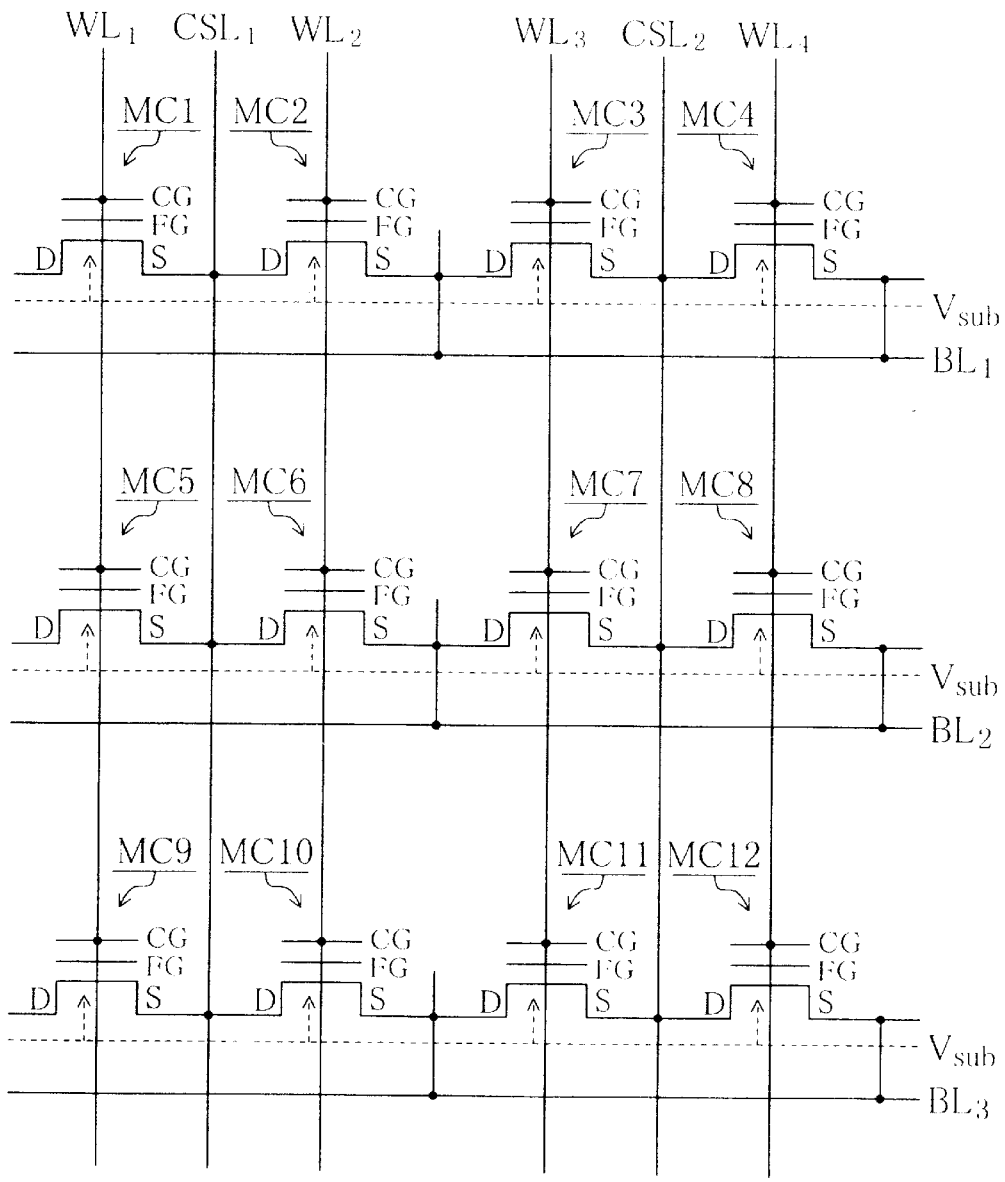
FIG. 23 is an equivalent circuit diagram of the nonvolatile semiconductor memory device according to the first embodiment of the invention.
Figure 24A:
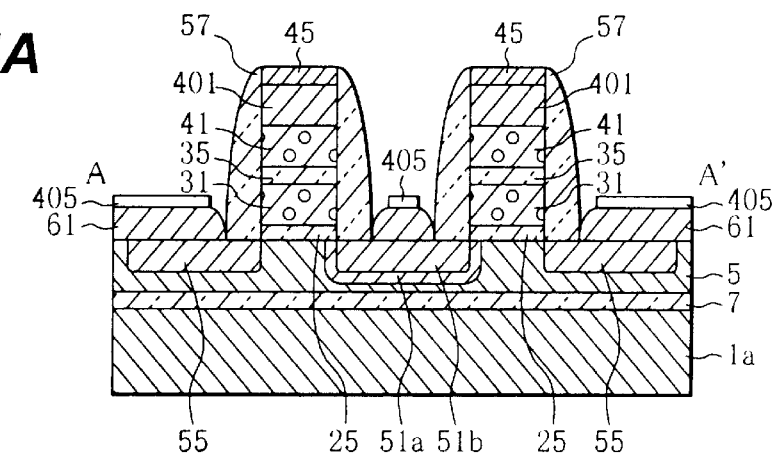
FIGS. 24A to 24D are cross sectional views showing the substrate structure of a nonvolatile semiconductor memory device after a W layer is selectively vapor-deposited on an exposed semiconductor layer of the substrate and illustrating the manufacture process for the device according to a modification of the first embodiment of the invention.
Figure 24B:
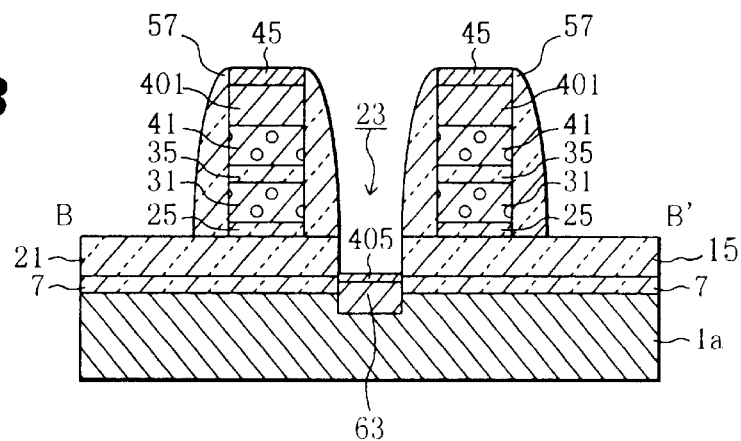
Figure 24C:
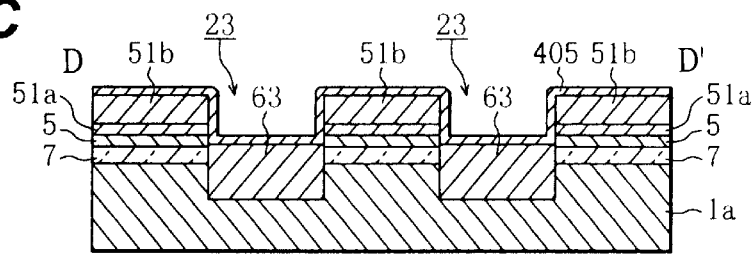
Figure 24D:
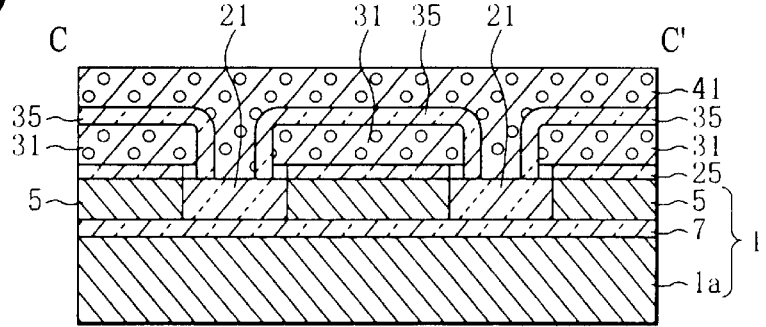

FIG. 23 is an equivalent circuit of a cell portion of the nonvolatile semiconductor memory device M of the first embodiment.

A data read, write and erase method for the nonvolatile semiconductor memory device M will be described with reference to FIG. 23.

The nonvolatile semiconductor memory device M has a number of memory cells MC disposed in a two-dimensional array. The nonvolatile semiconductor memory device M has a plurality of word lines WL1, WL2, WL3, WL4, extending in the column direction.

Between the two word lines, e.g., between the word lines WL1 and WL2, a common source line CSL1 extends in a direction (column direction) in parallel to the word line WL, and between the word lines WL3 and WL4 a common source line CSL2 extends. A plurality of bit lines BL1 BL2, BL3, extend in the row direction.

FIG. 23, only twelve memory cells MC1 to MC12 are shown for the drawing simplicity. In an actual nonvolatile semiconductor memory device, memory cells of, for example, 64 M bits or more are disposed in a two-dimensional array.

Each word line WL, e.g., WL3 is connected in common to the control gates CG of the memory cells MC3, MC7 and MC11 disposed in the same column direction.

As shown in the dotted line of FIG. 23, the substrate voltages Vsub is applied to each memory cell.

Each bit line BL, e.g., BL2 is connected in common to the drain electrodes D of the memory cells MC5, MC6, MC7 and MC 8 disposed in the same row direction.

The common source line CSL extends in the column direction, and the common source line CSL, e.g., CSL2 is disposed in parallel to the word line WL3. CSL2 is connected to the source electrodes S of the memory cells MC3, MC7 and MC11 disposed in the same column direction and to the source electrodes S of the memory cells MC4, MC8 and MC12 disposed in the same column direction.

A transistor of each memory cell can be applied with a common substrate potential Vsub from the substrate side.

With this layout, memory cells of the nonvolatile memory device M can be randomly accessed.

With reference to FIG. 23, the connection in each memory cell will be described more concretely. One memory cell, e.g., MC7 has one transistor with a source S, a drain D, a floating gate FG and a control gate CG. The source S of the transistor of MC7 is connected to the common source line CSL2, and the rain D thereof is connected to the bit line BL2.

The data read, write and erase operations of the memory cell MC7 will be described concretely.

In writing data "0" in the memory cell MC7, 0 V is applied as the substrate potential, +10 V is applied to WL3, +5 V is applied to BL2, and 0 V is applied to the common source line CSL2. Electrons in the drain region become hot carriers because of the avalanche phenomenon. Electrons given energy capable of passing over the barrier height of the first gate dielectric film are injected into the floating gate FG and accumulated therein.

In reading data stored in the memory cell MC7, 0 V is applied as the substrate potential Vsub, +5 V is applied to WL3, +1 V is applied to the bit line (BL) and 0 V is applied to the source line (SL).

If the amount of negative charges accumulated in the floating gate FG is large, the channel layer of the transistor is maintained as a p-type or depleted. Since the channel layer is not inverted into an n-type, the amount of current flowing through the source S and drain D of the transistor is small. If the amount of charges accumulated in the floating gate FG is small, electrons are induced in the channel layer of the transistor and the channel layer is inverted into the n-type. In this case, as a voltage is applied between the source S and drain D, current flows more than the case of the large charge amount.

The amount of current flowing through the source S and drain D is amplified by a known sense amplifier to judge whether the data stored in the memory cell MC7 is "0" or "1".

In erasing data stored in the memory cell MC7, 0 V is applied as the substrate potential Vsub, −10 V is applied to the word line WL3, +5 V is applied to the common source line CSL2, and the bit line BL2 is opened.

In this state, if the amount of charges accumulated in the floating gate FG is large (if stored data is "0"), electrons accumulated in the floating gate FG pass through the first gate dielectric film 25 shown in FIG. 21 by Fowler-Nordheim tunneling and enter the source S. Since the amount of charges in the floating gate FG is reduced, the data stored in the memory cell MC7 is erased.

If the bit lines BL1, BL2, BL3, . . . extending in the row direction and juxtaposed in the column direction are opened, data stored in all the memory cells MC3, MC7, MC11, . . . disposed in the same column direction as that of WL3 and CSL2 can be erased collectively.

Charges once accumulated in FG are constrained semieternally in FG until the data erase operation is performed. If data is once written in the memory cell, the refresh operation for the stored data is basically unnecessary.

The above operations are applicable to other memory cells.

As described above, data can be written, read or erased for each memory cell disposed in an array shape on the substrate of the nonvolatile semiconductor memory device M.

FIGS. 24A to 24D are cross sectional views illustrating a manufacture method for a nonvolatile semiconductor memory device according to a modification of the first embodiment.

The manufacture processes for a nonvolatile semiconductor memory device illustrated in FIGS. 24A to 24D include a process of depositing the second polysilicon layer 41 and a WSi metal silicide layer 401 on the second gate dielectric film 35 grown by the process shown in FIGS. 10A and 10B of the first embodiment, and then depositing the antireflection film 45.

The antireflection film 45 alleviates the influence of reflection from the substrate side during the exposure process of photolithography and functions as an etching stopper during the etching process for the self-aligned source (SAS) forming process.

The manufacture processes for the nonvolatile semiconductor memory device shown in FIGS. 24A to 24D also include a process of selectively growing a W layer 405 on the exposed semiconductor layer after the process of growing the source region connecting semiconductor layer 63 shown in FIGS. 18A to 18C of the first embodiment.

As W is grown by a selective growth method utilizing reduction of silane at a low temperature of about 200° C. to 300° C., the W layer can be selectively grown on the exposed semiconductor layer. The W layer will not be grown on the exposed dielectric layer. Since the W layer is grown at the low temperature, reaction with the underlying semiconductor layer will not progress and a WSi layer will not be formed.

In the nonvolatile semiconductor memory device according to the modification of the first embodiment, the metal silicide layer 401 of WSi is formed on the second polysilicon layer 41 constituting the control gate CG. The control gate CG has therefore a two-layer structure of the second polysilicon layer 41 and suicide layer 401. The antireflection film 45 is being deposited on the metal silicide layer 401.

The source regions 51 (51a, 51b) and source region connecting semiconductor layers 63 continuous in the column direction are electrically connected together by the W layers 405. Since the source region connecting semiconductor layer 63 is filled in the concave opening 23, the step between the convex source region 51 and concave opening 23 can be lowered and disconnection of the W layer at the step can be prevented. The source regions are electrically connected in the column direction to form the common source line CSL. The word lines WL and common source lines CSL both extend in the column direction.

The W layer 405 is also formed in the drain region 61 so that the sheet resistance of the drain region 61 lowers. When the W layer is grown, it is not grown on the WSi layer because the SiON antireflection film is formed on the WSi layer.

The other manufacture processes, element structures and operation are approximately equal to those of the nonvolatile semiconductor memory device of the first embodiment, except that the control gate CG has the two-layer structure of the second polysilicon layer 41 and WSi layer 401 and that the selectively grown W layer 405 is used for electrically connecting the source regions 51 and source region connecting semiconductor layers 63 continuous in the column direction.

As described so far, according to the modification of the first embodiment, the source regions 51 (51a, 51b) and source region connecting semiconductor layers 63 continuous in the column direction are not electrically connected directly but connected via the W layer 405.

In the modification of the embodiment, the source regions 51 (51a, 51b) adjacent in the column direction may be connected not only by the W layer 405 but also by the source region connecting semiconductor region 63.

As described so far, the SIMOX substrate is used as the substrate of the nonvolatile semiconductor memory device of the embodiment. Therefore, the parasitic capacitance of wiring layers can be reduced more considerably than when a normal Si substrate is used.

Since STI is used as the element separation method, the width of the element separation region can be made narrower than when LOCOS is used. High integration of the memory device is therefore possible.

The integration degree can be improved because the common source line CSL is used in common both by the memory cells disposed in the column direction and by the adjacent two memory cells in the same lines. The common source line CSL is formed in the region between the two word lines WL in a self-aligned manner. Therefore, the element characteristics can be improved, and in particular the source resistance of the transistor of each memory cell can be lowered.

The depth where the buried dielectric layer 7 is formed is uniform over the whole semiconductor substrate area. In the process of exposing the surface of the semiconductor layer functioning as a seed layer for growing the source region connecting semiconductor layer 63, the buried dielectric layer 7 is used as the etching stopper. Therefore, the height of the surface of the source region connecting semiconductor layer 63 becomes generally uniform in the concave opening 23, and the step is generally uniform in the whole substrate area.

The metal silicide layer or metal layer is formed on the common source line CSL so that the sheet resistance of the common source line lowers. Since the influence of a voltage drop on the common source line CSL is alleviated, a variation in charge amounts accumulated in the floating gate FG of each memory cell can be reduced during the memory operation, particularly during the collective erase of memory data.

According to the embodiment method of manufacturing a nonvolatile semiconductor memory device, when the common source line is formed, the STI dielectric layer and the buried dielectric layer of the SIMOX substrate in the same column of the source regions can be removed. When the buried dielectric layer of the SIMOX substrate is removed, the surface of the underlying substrate is exposed. Therefore, the etching automatically stops and the depth of the opening becomes uniform. Semiconductor is grown by using as a seed layer the semiconductor substrate exposed at the bottom of the opening. A step between the source region connecting semiconductor layer and the source region is uniform in the whole substrate area after the semiconductor layer is grown. A variation in the element characteristics of each memory can be reduced in the whole substrate area.

When the common source line CSL is formed, the conductive layer is buried in the opening so that the step between the source region and adjacent opening can be lowered. Therefore, a probability of disconnection of a metal silicide (TiSi) layer or metal layer on the common source line can be lowered.

If the source region connecting semiconductor region in contact with the source region is made thick, the sheet resistance of the common source line CSL can be lowered further.

Since the conductive layer of low resistance metal silicide, W or the like is formed on the source and drain regions and word lines, the sheet resistance thereof can be lowered. High performance of each transistor is therefore possible.

The present invention has been described in connection with the preferred embodiments of a nonvolatile semiconductor memory device and its manufacture. The invention is not limited only to the above embodiments. It is apparent that various modifications, improvements, combinations, and the like can be made by those skilled in the art.

What is claimed is:

1. A method of manufacturing a nonvolatile semiconductor memory device comprising the steps of:

separating a first conductivity type semiconductor layer formed on a semiconductor substrate having a buried dielectric layer on a front surface side of the semiconductor substrate, by forming a plurality of trenches elongated in a row direction;

filling a dielectric layer in the trenches;

forming a first gate dielectric film at least on the first conductivity type semiconductor layer;

forming a first conductive polysilicon layer on the substrate formed with the first gate dielectric film;

removing the first polysilicon layer to leave islands disposed apart from each other in the row direction;

forming a second gate dielectric film at least on a surface of the first polysilicon layer;

forming a second polysilicon layer on the second gate dielectric film;

etching at least the second polysilicon layer, the second gate dielectric layer and the first polysilicon layer in a striped-shape in a column direction to form a stacked-layer structure including the second polysilicon layer, the second gate dielectric layer and the first polysilicon layer;

forming source and drain regions in the first conductivity type semiconductor layer on both sides of the stacked-layer structure by alternately introducing impurities of the first conductivity type and impurities of a second conductivity type opposite to the first conductivity type;

forming dielectric side spacer films on both side walls of the stacked-layer structure extending in the column direction;

removing those portions of the dielectric layer that are between source regions adjacent in the column direction and the buried dielectric layer under said dielectric layer to expose a surface of the semiconductor substrate;

growing a source region connecting semiconductor layer at least on the semiconductor substrate surface exposed by removing the buried dielectric layer;

introducing the second conductivity type impurities at least into the source region connecting semiconductor layer; and forming a conductive film at least on the source regions and the source region connecting semiconductor layer, the conductive film extending in the column direction same as a direction of the source regions and the source region connecting semiconductor layer.

2. A method of manufacturing a nonvolatile semiconductor memory device according to claim 1, further comprising the steps of:

forming an interlayer insulation film over the semiconductor substrate, the interlayer insulation film covering the stacked-layer structure and the conductive film;

forming contact holes by forming openings through the interlayer insulation film over the drain regions; and forming a plurality of drain wiring layers for electrically connecting a plurality of drain regions disposed on a same row via the contact holes.

3. A method of manufacturing a nonvolatile semiconductor memory device according to claim 1, further comprising a step of forming a dielectric antireflection film on the second polysilicon layer.

4. A method of manufacturing a nonvolatile semiconductor memory device according to claim 1, wherein said conductive film forming step includes a step of selectively growing the conductive film on the source region connecting semiconductor layer and source region.

5. A method of manufacturing a nonvolatile semiconductor memory device according to claim 1, further comprising a step of forming a lightly doped region of the second conductivity type at an impurity concentration lower than the source region, the lightly doped region surrounding the source region in the first conductivity type semiconductor layer.

6. A method of manufacturing a nonvolatile semiconductor memory device according to claim 1, wherein said conductive film forming step includes a subsidiary step of depositing a reactive metal layer over the semiconductor substrate, the reactive metal layer capable of reacting with the source region connecting semiconductor layer and a semiconductor layer of the source region.

7. A method of manufacturing a nonvolatile semiconductor memory device according to claim 6, wherein said conductive film forming step includes a subsidiary step of reacting the reactive metal layer with the source region connecting semiconductor layer and the semiconductor layer of the source region.

8. A method of manufacturing a nonvolatile semiconductor memory device according to claim 7, wherein said conductive film forming step includes a step of removing an unreacted metal layer left on the dielectric side spacer films after said subsidiary step of reacting the reactive metal layer with the source region connecting semiconductor layer and the semiconductor layer of the source region.

* * * * *